(12) United States Patent
Richards

(10) Patent No.: US 9,990,087 B2
(45) Date of Patent: Jun. 5, 2018

(54) COMPENSATION FOR NONLINEAR VARIATION OF GAP CAPACITANCE WITH DISPLACEMENT

(71) Applicant: Apple Inc., Cupertino, CA (US)

(72) Inventor: Peter W. Richards, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 15/025,251

(22) PCT Filed: Sep. 28, 2013

(86) PCT No.: PCT/US2013/062497
§ 371 (c)(1),
(2) Date: Mar. 25, 2016

(87) PCT Pub. No.: WO2015/047357
PCT Pub. Date: Apr. 2, 2015

(65) Prior Publication Data
US 2016/0209984 A1 Jul. 21, 2016

(51) Int. Cl.
*G06F 3/041* (2006.01)
*H03K 17/96* (2006.01)
(Continued)

(52) U.S. Cl.
CPC ............ *G06F 3/0418* (2013.01); *G06F 3/044* (2013.01); *G06F 3/0414* (2013.01);
(Continued)

(58) Field of Classification Search
CPC ...... G06F 3/0418; G06F 3/0414; G06F 3/044; G06F 2203/04106; G06F 2203/04103;
(Continued)

(56) References Cited

U.S. PATENT DOCUMENTS 3,783,394 A 1/1974 Avery
4,310,840 A 1/1982 Williams et al.
(Continued)

FOREIGN PATENT DOCUMENTS

EP 2357547 8/2011

OTHER PUBLICATIONS

U.S. Appl. No. 12/542,354, filed Aug. 17, 2009, Pance et al.
(Continued)

*Primary Examiner* — Jose Soto Lopez
(74) *Attorney, Agent, or Firm* — Brownstein Hyatt Farber Schreck, LLP

(57) ABSTRACT

A capacitive force sensor characterization system for calibrating a capacitive force sensor included in a personal electronic device. The capacitive force sensor includes a first capacitor plate coupled to a flexible element of the personal electronic device, which is coupled to the device housing, and a second capacitor plate coupled to an internal structural member of the personal electronic device. The internal structural member is not coupled to the housing during the characterization. The capacitive force sensor characterization system includes: a housing fixture adapted to hold the housing of the personal electronic device; a member fixture adapted to hold the internal structural member of the personal electronic device; a positioner coupled to at least one of the housing fixture or the member fixture; a position sensor; control circuitry electrically coupled to the positioner to provide a drive signal to the positioner; and a processor coupled to the first and second capacitor plates and the position sensor. The positioner is adapted to vary the gap width between the first and second capacitor plates in response to the drive signal. The position sensor is adapted to measure differences in the gap width between the capacitor plates relative to an initial gap width. The control
(Continued)

circuitry is adapted to generate the drive signal following a test procedure such that, in response to the drive signal, the positioner varies the gap width between the capacitor plates from the initial gap width to at least two test gap widths. The processor adapted to determine: a capacitive sensor gain; a capacitive sensor offset; and an initial effective separation between the capacitor plates.

24 Claims, 8 Drawing Sheets

(51) Int. Cl.
*H03K 17/98* (2006.01)
*G06F 3/044* (2006.01)
(52) U.S. Cl.
CPC ........... *H03K 17/962* (2013.01); *H03K 17/98* (2013.01); *G06F 2203/04103* (2013.01); *G06F 2203/04106* (2013.01); *H03K 2217/9401* (2013.01); *H03K 2217/960765* (2013.01)
(58) Field of Classification Search
CPC ................ H03K 17/98; H03K 17/962; H03K 2217/9401; H03K 2217/960765
See application file for complete search history.

(56) References Cited

U.S. PATENT DOCUMENTS

| | | | |
|---|---|---|---|
| 4,539,554 A | 9/1985 | Jarvis et al. | |
| 4,745,565 A * | 5/1988 | Garwin ................ | G06F 3/0414 178/18.02 |
| 5,008,497 A | 4/1991 | Asher | |
| 5,241,308 A * | 8/1993 | Young .................. | G06F 3/0414 341/22 |
| 5,625,292 A * | 4/1997 | Crook .................... | G01R 31/04 324/537 |
| 6,002,389 A | 12/1999 | Kasser | |
| 6,278,888 B1 | 8/2001 | Hayes, Jr. et al. | |
| 6,567,102 B2 | 5/2003 | Kung | |
| 6,664,489 B2 | 12/2003 | Kleinhans et al. | |
| 6,723,937 B2 | 4/2004 | Englemann et al. | |
| 7,006,078 B2 | 2/2006 | Kim | |
| 7,106,311 B2 * | 9/2006 | Tsang ................... | G06F 3/0418 178/18.02 |
| 7,109,978 B2 | 9/2006 | Gillespie et al. | |
| 7,154,481 B2 | 12/2006 | Cross et al. | |
| 7,242,395 B2 | 7/2007 | Kurashima et al. | |
| 7,378,856 B2 * | 5/2008 | Peine .................... | A61B 5/037 324/605 |
| 7,595,788 B2 | 9/2009 | Son | |
| 7,663,612 B2 | 2/2010 | Bladt | |
| 7,816,838 B2 | 10/2010 | Leskinen et al. | |
| 7,825,907 B2 | 11/2010 | Choo et al. | |
| 7,884,315 B2 | 2/2011 | Andre et al. | |
| 8,261,621 B2 * | 9/2012 | Parikh .................... | G01L 5/008 73/862.041 |
| 8,266,971 B1 * | 9/2012 | Jones ...................... | G01L 1/146 73/862.046 |
| 8,390,481 B2 | 3/2013 | Pance et al. | |
| 9,013,195 B2 * | 4/2015 | Kremin ................. | G06F 3/0418 324/658 |
| 9,024,907 B2 * | 5/2015 | Bolender .............. | G06F 3/0414 345/173 |
| 9,069,426 B2 | 6/2015 | Pance et al. | |
| 9,323,353 B1 * | 4/2016 | Sivertsen ............... | G06F 3/0346 |
| 2002/0158637 A1 * | 10/2002 | Warmack ............. | G01R 35/005 324/601 |
| 2003/0214485 A1 * | 11/2003 | Roberts ................. | G06F 3/0414 345/173 |
| 2005/0024065 A1 * | 2/2005 | Umeda ................. | G01D 5/2417 324/663 |
| 2006/0161364 A1 * | 7/2006 | Wang .................... | G01L 9/0072 702/98 |
| 2006/0267953 A1 * | 11/2006 | Peterson, Jr. ......... | G06F 3/0418 345/173 |
| 2006/0279548 A1 * | 12/2006 | Geaghan ............... | G06F 3/0416 345/173 |
| 2007/0074913 A1 * | 4/2007 | Geaghan ................ | G06F 3/044 178/18.06 |
| 2007/0103449 A1 * | 5/2007 | Laitinen .................. | G06F 3/016 345/173 |
| 2008/0068229 A1 * | 3/2008 | Chuang .................. | G06F 3/0418 341/34 |
| 2008/0111559 A1 * | 5/2008 | Choi .................... | G01R 27/2641 324/601 |
| 2008/0134748 A1 * | 6/2008 | Hay ........................ | G01B 3/008 73/1.79 |
| 2008/0135310 A1 * | 6/2008 | Pomposo Alonso . | G01L 9/0075 178/18.05 |
| 2009/0002199 A1 | 1/2009 | Lainonen et al. | |
| 2009/0025987 A1 * | 1/2009 | Perski ...................... | G06F 3/041 178/18.03 |
| 2009/0066674 A1 * | 3/2009 | Maharyta ............. | G06F 3/03547 345/178 |
| 2010/0024573 A1 * | 2/2010 | Daverman .............. | G01L 1/142 73/862.626 |
| 2010/0148813 A1 * | 6/2010 | Erickson ............... | G01R 31/312 324/754.03 |
| 2010/0207905 A1 * | 8/2010 | Chang .................... | G06F 3/0418 345/174 |
| 2011/0018558 A1 * | 1/2011 | Saito ....................... | G06F 3/0338 324/676 |
| 2011/0050620 A1 * | 3/2011 | Hristov .................. | G06F 3/0416 345/174 |
| 2011/0084932 A1 * | 4/2011 | Simmons .............. | G06F 3/0414 345/174 |
| 2011/0090174 A1 * | 4/2011 | Lin ........................ | G06F 3/0412 345/174 |
| 2011/0163991 A1 * | 7/2011 | Tout ........................ | G06F 3/016 345/174 |
| 2011/0227872 A1 * | 9/2011 | Huska ..................... | G06F 3/016 345/174 |
| 2011/0235156 A1 | 9/2011 | Kothari et al. | |
| 2011/0278078 A1 * | 11/2011 | Schediwy ............... | G01L 1/146 178/18.06 |
| 2011/0296929 A1 * | 12/2011 | Tohmyoh ............... | B82Y 35/00 73/862.626 |
| 2012/0050180 A1 * | 3/2012 | King ....................... | G06F 3/0416 345/173 |
| 2012/0146956 A1 * | 6/2012 | Jenkinson ............... | G06F 3/0418 345/178 |
| 2012/0274599 A1 * | 11/2012 | Schediwy ............... | G06F 3/016 345/174 |
| 2012/0280934 A1 * | 11/2012 | Ha ......................... | G06F 3/0416 345/174 |
| 2012/0319987 A1 * | 12/2012 | Woo ....................... | G06F 3/016 345/174 |
| 2013/0278539 A1 * | 10/2013 | Valentine .............. | G06F 3/0418 345/174 |
| 2013/0285971 A1 * | 10/2013 | Elias ...................... | G06F 3/044 345/174 |
| 2013/0285972 A1 * | 10/2013 | Elias ...................... | G06F 3/0416 345/174 |
| 2013/0285973 A1 * | 10/2013 | Elias ...................... | G06F 3/044 345/174 |
| 2013/0307810 A1 * | 11/2013 | Verweg .................. | G06F 3/044 345/174 |
| 2013/0342468 A1 * | 12/2013 | Hekstra ................. | G06F 3/0418 345/173 |
| 2013/0342501 A1 * | 12/2013 | Molne .................... | G06F 3/0414 345/174 |
| 2014/0085246 A1 * | 3/2014 | Shahparnia ........... | G06F 3/044 345/174 |
| 2014/0104184 A1 * | 4/2014 | Meador ................ | G02B 26/001 345/173 |

(56) References Cited

U.S. PATENT DOCUMENTS

| | | | | |
|---|---|---|---|---|
| 2014/0176480 A1* | 6/2014 | Shepelev | ................ | G06F 3/044 345/174 |
| 2015/0062082 A1* | 3/2015 | Pyoun | .................... | G01R 31/00 345/174 |
| 2015/0070037 A1* | 3/2015 | Pragada | ............. | G01R 1/06705 324/754.03 |

OTHER PUBLICATIONS

U.S. Appl. No. 13/705,773, filed Jan. 25, 2013, Pance et al.
U.S. Appl. No. 14/740,223, filed Jun. 15, 2015 Pance et al.
International Search Report and Written Opinion dated Jul. 1, 2014, PCT/US2013/062497, 15 pages.
Written Opinion dated Aug. 26, 2015, PCT/US2013/062497, 9 pages.
Preliminary Report on Patentability dated Dec. 8, 2015, PCT/US2013/062497, 11 pages.

* cited by examiner

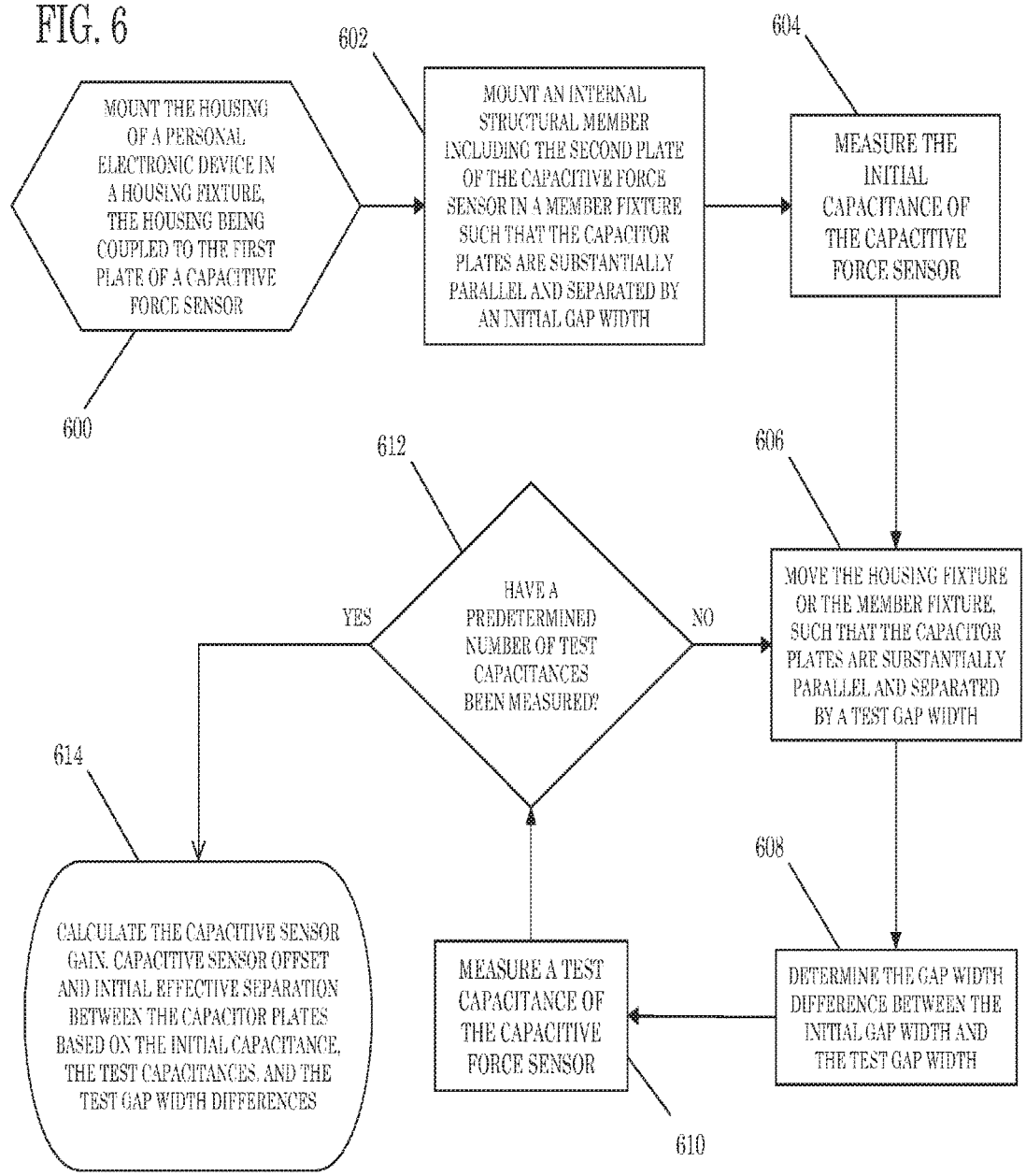

COMPENSATION FOR NONLINEAR VARIATION OF GAP CAPACITANCE WITH DISPLACEMENT

CROSS REFERENCE TO RELATED APPLICATION

This application is a 35 U.S.C. § 371 application of PCT/US2013/062497, filed on Sep. 28, 2013, and entitled "Compensation for Nonlinear Variation of Gap Capacitance with Displacement," which is incorporated by reference as if fully disclosed herein.

BACKGROUND

Field of the Disclosure

This application generally relates to capacitive force sensors, and relates particularly to methods of characterizing and calibrating capacitive force sensors.

Background of the Disclosure

Touch devices generally provide for identification of positions where the user touches the device, including movement, gestures, and other effects of position detection. For a first example, touch devices can provide information to a computing system regarding user interaction with a graphical user interface (GUI), such as pointing to elements, reorienting or repositioning those elements, editing or typing, and other GUI features. For a second example, touch devices can provide information to a computing system suitable for a user to interact with an application program, such as relating to input or manipulation of animation, photographs, pictures, slide presentations, sound, text, other audiovisual elements, and otherwise.

Some touch devices are able to determine a location of touch, or multiple locations for more than one touch, using sensing devices that are additional to those sensing devices already part of the touch device.

Generally, however, touch is binary. The touch is present and sensed, or it is not. This is true of many user inputs and input/output devices. A key of a keyboard, for example, is either pressed sufficiently to collapse a dome switch and generate an output signal, or it is not. A mouse button is either pressed sufficiently to close a switch, or it is not. Very few electronic devices employ force as a variable input.

BRIEF SUMMARY OF THE DISCLOSURE

One example embodiment, as described herein, is a capacitive force sensor characterization system for calibrating a capacitive force sensor included in a personal electronic device. The capacitive force sensor includes a first capacitor plate coupled to a flexible element of the personal electronic device, which is coupled to the device housing, and a second capacitor plate coupled to an internal structural member of the personal electronic device. The internal structural member is not coupled to the housing during the characterization. The capacitive force sensor characterization system includes: a housing fixture adapted to hold the housing of the personal electronic device; a member fixture adapted to hold the internal structural member of the personal electronic device; a positioner coupled to at least one of the housing fixture or the member fixture; a position sensor; control circuitry electrically coupled to the positioner to provide a drive signal to the positioner; and a processor coupled to the first and second capacitor plates and the position sensor. The positioner is adapted to vary the gap width between the first and second capacitor plates in response to the drive signal. The position sensor is adapted to measure differences in the gap width between the capacitor plates relative to an initial gap width. The control circuitry is adapted to generate the drive signal following a test procedure such that, in response to the drive signal, the positioner varies the gap width between the capacitor plates from the initial gap width to at least two test gap widths. The processor adapted to determine: a capacitive sensor gain; a capacitive sensor offset; and an initial effective separation between the capacitor plates.

Another example embodiment, as described herein, is a method of characterizing a capacitive force sensor included in a personal electronic device. The capacitive force sensor includes a first capacitor plate coupled to a flexible element of the personal electronic device, is coupled to the housing of the personal electronic device, and a second capacitor plate coupled to an internal structural member of the personal electronic device. The housing of the personal electronic device is mounted in a housing fixture. The internal structural member is mounted in a member fixture such that the first capacitor plate and the second capacitor plate of the capacitive force sensor are substantially parallel and separated by an initial gap width. An initial capacitance value between the first capacitor plate and the second capacitor plate of the capacitive force sensor is measured. One of the housing fixture or the member fixture is moved, such that the capacitor plates of the capacitive force sensor are substantially parallel and separated by a test gap width. The gap width difference between the initial gap width and the test gap width is determined. A test capacitance value between the capacitor plates of the capacitive force sensor is determined. The steps of moving one of the fixtures, measuring a test capacitance value, and determining a gap width difference are repeated a predetermined number of times. A capacitive sensor gain, a capacitive sensor offset and an initial effective separation between the capacitor plates are calculated based on the initial capacitance value, the test capacitance values, and the corresponding test gap width differences between the capacitor plates.

A further example embodiment, as described herein, is a method of recalibrating a capacitive force sensor that has previously been characterized to determine a capacitive sensor gain, a capacitive sensor offset, and a calibrated effective separation between the first capacitor plate and the second capacitor plate of the capacitive force sensor with zero applied force. A recalibration capacitance value between the capacitor plates of the capacitive force sensor is measured. The recalibration capacitance value is measured with zero applied force on the capacitive force sensor. A recalibrated effective separation between the capacitor plates with zero applied force is calculated based on the capacitive sensor gain, the capacitive sensor offset, and the recalibration capacitance value between the capacitor plates of the capacitive force sensor.

While multiple embodiments are disclosed, including variations thereof, still other embodiments of the present disclosure will become apparent to those skilled in the art from the following detailed description, which shows and describes illustrative embodiments of the disclosure. As will be realized, the disclosure is capable of modifications in various obvious aspects, all without departing from the spirit and scope of the present disclosure. Accordingly, the drawings and detailed description are to be regarded as illustrative in nature and not restrictive.

BRIEF DESCRIPTION OF THE FIGURES

While the specification concludes with claims particularly pointing out and distinctly claiming the subject matter that is regarded as forming the present disclosure, it is believed that the embodiments are best understood from the following detailed description when read in connection with the accompanying drawing. It should be understood that the various features of the drawing may not be to scale. Likewise, the dimensions of the various features may be altered for clarity. Included in the drawings and/or illustrations are the following figures:

FIG. 6 is a flowchart illustrating an example method of characterizing a capacitive force sensor, as described herein;

DETAILED DESCRIPTION

Terminology

Figure 1:
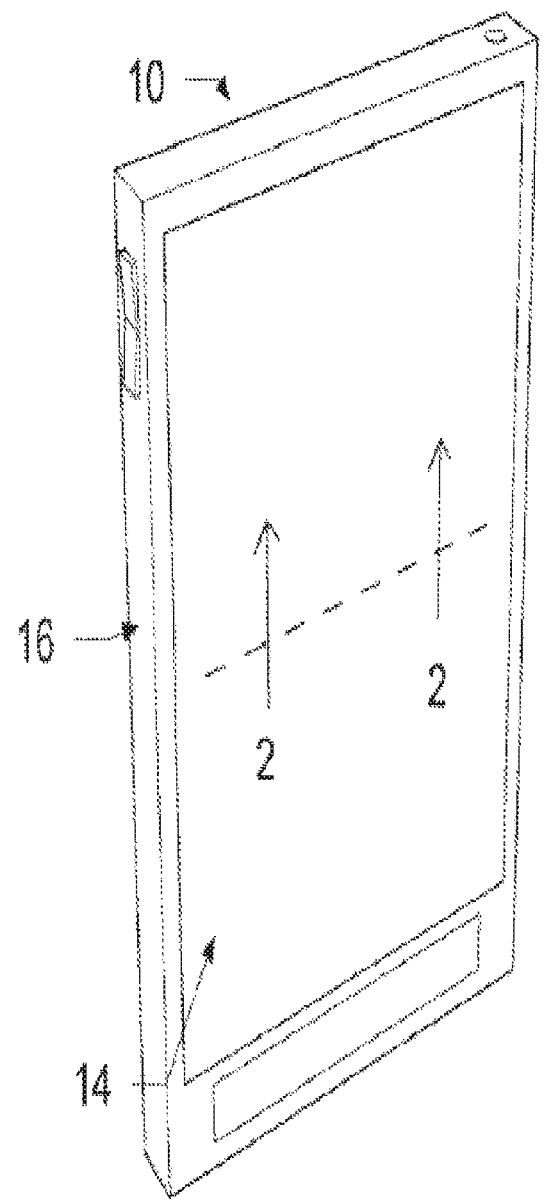
FIG. 1 is a front perspective view of an example of a personal electronic device including a capacitive force sensing device, as described herein.

The following terminology is exemplary, and not intended to be limiting in any way.

The text "applied force", and variants thereof, generally refers to a degree or measure of an amount of force being applied to a device. The degree or measure of applied force need not have any particular scale. For example, the measure of applied force can be linear, logarithmic, or otherwise nonlinear, and can be adjusted periodically for otherwise, such as aperiodically, or otherwise from time to time) in response to one or more factors, either relating to applied force, location of touch, time, or otherwise. Zero applied force refers to a situation in which no external objects are pressing on the flexible element of the capacitive force sensor The text "force sensing element", and variants thereof, generally refers to one or more sensors or sensing elements, that may detect an input that may be correlated to force, or a direct force input. For example, a capacitive sensing element may serve as a force sensing element by measuring a change in capacitance that occurs due to a deflection or motion of some portion of a device. That change in capacitance may be employed to determine a force acting on the device. Likewise, strain sensors may function as force sensing devices. Generally, a force sensing element may detect an input or generate an output correlative to a force, including information sensed with respect to applied force, whether at individual locations or otherwise. For example and without limitation, a force sensing element may detect, in a relatively small region, where a user is forcibly contacting a device.

The text "surface flex", and variants thereof, generally refers to any substantial amount of flex or other deformation of a device when force is applied to that device. For example and without limitation, surface flex can include deformation, at one or more points, of a cover glass element or other surface of the device, of a device stack positioned below that cover glass element, or otherwise.

The text "user contact", and variants thereof, and references to applied force, or contact, or touch by the user, all generally refer to any form by which a user can apply force to the device. For example and without limitation, this includes contact by a user's finger, or a stylus or other device, such as when used by a user to apply force to a touch device, or to otherwise contact a touch device. For example and without limitation, "user contact" can include any part of the user's finger, the user's hand, a covering on the user's finger, a soft or hard stylus, a light pen or air brush, or any other device used for pointing, touching, or applying force to, a touch device or a surface thereof.

After reading this application, those skilled in the art would recognize that these statements of terminology would be applicable to techniques, methods, physical elements, and systems (whether currently known or otherwise), including extensions thereof inferred or inferable by those skilled in the art after reading this application.

Overview

The present disclosure is related to a capacitive force sensing device that may be incorporated into a variety of electronic or computing devices, such as, but not limited to, computers, smart phones, tablet computers, track pads, wearable devices, small form factor devices, and so on. The capacitive force sensing device may be used to detect one or more user force inputs on an input surface and then a processor (or processing unit) may correlate the sensed inputs into a force measurement and provide those inputs to the computing device. In some embodiments, the capacitive force sensing device may be used to determine force inputs to a track pad, a display screen, or other input surface.

The capacitive force sensing device may include an input surface, one or more sensing plates (such as capacitive plates), a spacing layer, and a substrate or support layer. The input surface provides an engagement surface for a user, such as the external surface of a track pad or the cover glass for a display. In other words, the input surface may receive one or more user inputs directly or indirectly.

Figure 3:
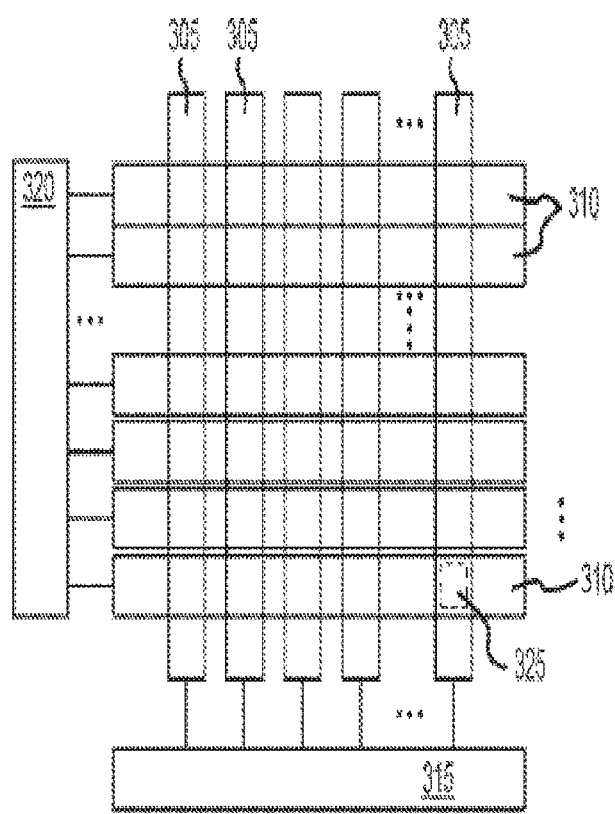
FIG. 3 is a conceptual drawing illustrating an alternative example array of capacitive sensing elements, as described herein.

The number of sensing plates may depend on whether the capacitive sensors are configured for mutual capacitance or self-capacitance. For example, in instances where self-capacitance may be used, a shielding member or plate may replace one of the sensing plates, such that the capacitive force sensing device may include one sensing plate and one shielding member or plate. In these examples, the shielding member may help to isolate the sensing plate from noise sources that may produce errors in the sensed inputs. In some embodiments, the sensing elements, such as capacitive sensors, may be defined by the intersections of rows and columns, as illustrated in FIG. 3. In these embodiments, the rows and/or columns may be driven any number of ways, for example, sequentially, in a pattern (e.g., groups of rows and/or columns at a time with different waveforms), or simultaneously. In other embodiments, the capacitive sensors may be defined by an array, grid, or other layout of capacitive sense elements that are spaced apart and/or not connected to each other.

Example capacitive force sensors, as described herein, are designed such that applied force on the input surface of the capacitive force sensor causes a change in the separation, or gap width, between the two capacitor plates (whether two sensing plates or one sensing plate and one shielding plate) of capacitor sensing elements in the capacitive force sensor. This change in the gap width may be modeled as proportional to the applied force. Thus, in example capacitive force sensors, as described herein, it may be useful to determine the applied force based on changes in the thickness of the gap width under the applied force, rather than the absolute thickness of the spacing layer.

It is noted, however, that the gap between the two capacitor plates may include multiple layers of different materials, which each may have a different dielectric constant. Thus, to determine the capacitance of an example capacitive sensing element, as described herein, it may be useful to treat the example capacitive sensing element as a number of 'capacitors' connected in series, each having a separation equal with one of the material layers (and having a uniform dielectric constant), as shown in Equation 1:

$1/C_{Total} = 1/C_0 + 1/C_1 + 1/C_2 + \ldots + 1/C_N;$ or $$1/C_{Total} = z_0/(D_0 A) + z_1/(D_1 A) + z_2/(D_2 A) + \ldots + z_N/(D_N A),$$  Equation 1 where N+1 is the number of layers, $C_{Total}$ is the total capacitance of the capacitive sensing element, $C_i$ is the capacitance of the $i^{th}$ series 'capacitor,' $z_i$ is the separation of the $i^{th}$ series 'capacitor,' $D_i$ is the dielectric constant of the material of $i^{th}$ series 'capacitor,' and A is the plate area of the capacitive sensing element.

As may be seen from Equation 1, changes in the total capacitance of the example capacitive sensing element are a nonlinear function of the changes in the capacitances of the series 'capacitors.' If the layers between the capacitor plates are configured so that almost all of the change in the gap width based on a user input occurs in one of these layers, the spacing layer, Equation 1 may be simplified, as shown by Equation 2:

$1/C_{Total\_AF} = (z_0 + \Delta z)/(D_0 A) + z_1/(D_1 A) + z_2/(D_2 A) + \ldots + z_N/(D_N A),$ or rearranged;

$(D_0 A)/C_{Total\_AF} = \Delta z + [z_0 + D_0(z_1/D_1 + z_2/D_2 + \ldots + z_N/D_N)],$ substituting:

$z_{eff} = z_0 + D_0(z_1/D_1 + z_2/D_2 + \ldots + z_N/D_N),$ leads to:

$(D_0 A)/C_{Total\_AF} = \Delta z + z_{eff};$ or $$\Delta z = (D_0 A)/C_{Total\_AF} - z_{eff},$$  Equation 2 where $C_{Total\_AF}$ is the total capacitance of the capacitive sensing element under applied force, $\Delta z$ is the gap width change of the $0^{th}$ layer (i.e. the spacing layer) due to the applied force, and $z_{eff}$ is the initial effective separation between the capacitor plates scaled to the dielectric constant of the spacing layer, $D_0$. The spacing layer may be a gap between one or more components of the capacitive force sensing device (e.g., air), or may be a gel, foam, or other deformable material. The spacing layer may typically be configured to change in size or thickness based on a user input. That is, the spacing layer may be deformable or otherwise variable in at least one dimension.

It may be seen in Equation 2 that changes to $z_{eff}$ may affect the sensitivity of $\Delta z$ to capacitance change, and so knowing the value of $z_{eff}$ may facilitate accurately determining $\Delta z$ from changes in capacitance. During manufacture, small variations in the thickness of the various layers separating the capacitor plates may occur between different capacitive force sensors, and even between capacitive sensing elements within the same capacitive force sensor. Thus, an accurate method to determine the effective gap width of the capacitive sensing elements is useful for characterization of the example capacitive force sensor. However, it is noted that $\Delta z$ always less than $z_{eff}$ and may typically be quite small in comparison to $z_{eff}$. Direct measurement of $z_{eff}$ for each capacitive sensing element of an example capacitive force sensor, as described herein, may be non-trivial and may be impractical for mass production of personal electronics devices. Example embodiments, as described herein, include methods and systems for characterizing example capacitive force sensors, including indirectly determining the effective gap width.

Additionally, the thickness of the spacing layer may change over time due to settling or fatiguing of components of the personal electronics device containing the capacitive force sensor, and/or damage to the personal electronics device. Example embodiments, as described herein, include methods for recalibrating example capacitive force sensors, including indirectly recalibrating the effective gap width.

Force Sensitive Device and System

Turning now to the figures, illustrative personal electronic devices that may incorporate the capacitive force sensing device may be discussed in more detail. FIG. 1 a top perspective view of a tablet computer used herein as a sample personal electronic device that may incorporate one or more example capacitive force sensing devices, as described in more detail herein. The use of tablet computer 10 is merely illustrative and intended as limited. It is contemplated that example embodiments, as described herein, may be used in other personal electronic devices, such as, but not limited to, laptop or desktop computers, smart phones, tablet computers, track pads, and various wearable devices.

The tablet computer 10 may include a display 14 and an enclosure 16 or frame. The enclosure 16 may extend around a portion of the display 14. In the example embodiment illustrated in FIG. 1, the capacitive force sensing device may be incorporated into the display 14 to detect force inputs to the display 14. In other example embodiments, the capacitive force sensing device may be configured to detect force inputs to a track pad and/or other input component.

In one embodiment, the example personal electronic device includes a device frame, such as the enclosure 16, enclosing a set of circuits and data elements. In some embodiments, the circuits and data elements can include a cover glass (CG) element, a display stack, and one or more capacitance sensing layers, such as described herein. The cover glass (CG) element and display stack can be flexible with respect to applied force. This can have the effect that the force sensitive device can determine a measure of capacitance with respect to surface flex, and can determine an amount and location of applied force in response thereto. Essentially, as the surface of the cover glass flexes, the compressible gap (e.g., distance between the sensing plates or capacitive sensing elements) may decrease, resulting in an increase in capacitance measured at one or both of the plates/elements. This increase in capacitance may be correlated to a force that caused the surface flex, as described in more detail elsewhere herein.

In one embodiment, the cover glass element is coupled to a frame, such as the enclosure 16, for the touch device, such as a case constructed of metal, elastomer, plastic, a combination thereof, or some other substance. In such cases, the frame for the touch device can include a shelf on which the cover glass element is positioned above circuitry for the touch device. For example, the frame can include a shelf on which an edge of the cover glass element is positioned, with at least some of the remainder of the cover glass element positioned over the circuitry for the touch device. In this context, "over" the circuitry refers to being positioned above the circuitry when the display for the touch device is positioned for a user above the touch device.

Figure 2A:
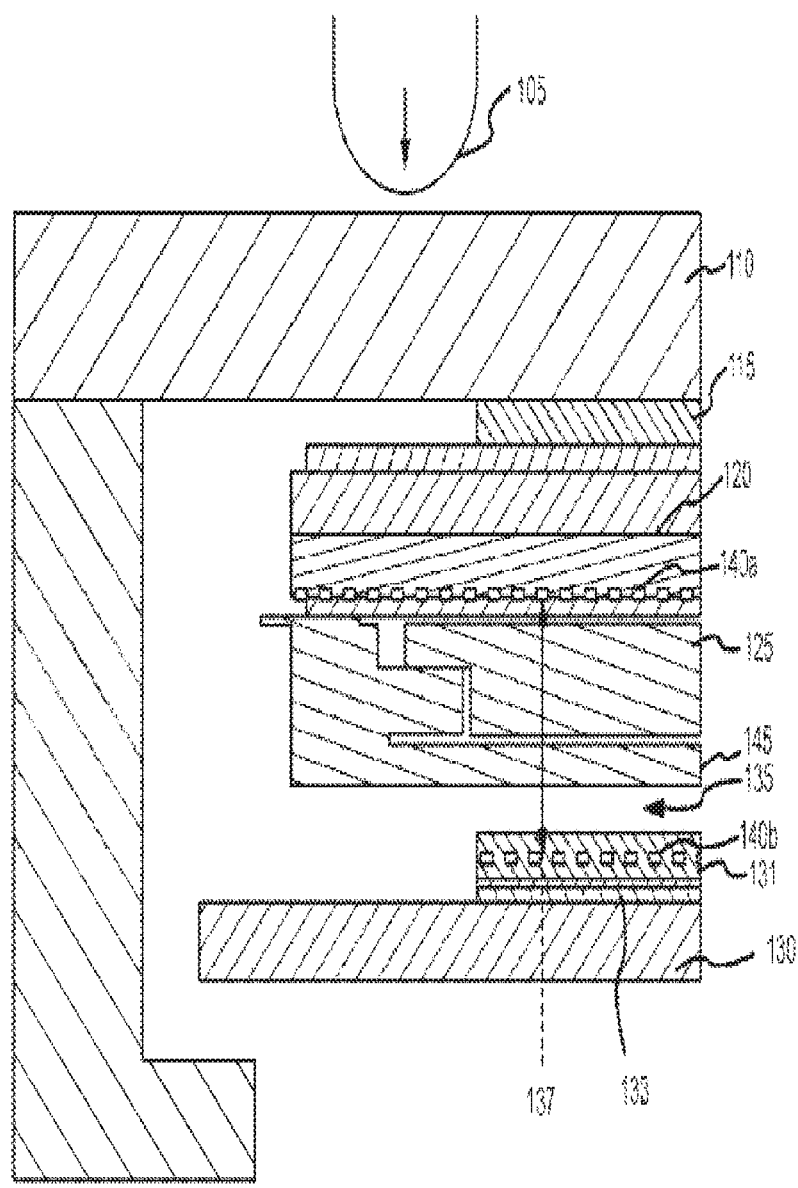
FIG. 2A is a partial side cut-away view of the example personal electronic device of FIG. 1 including an example capacitive force sensor, as described herein, cut along line 2-2.
Figure 2B:
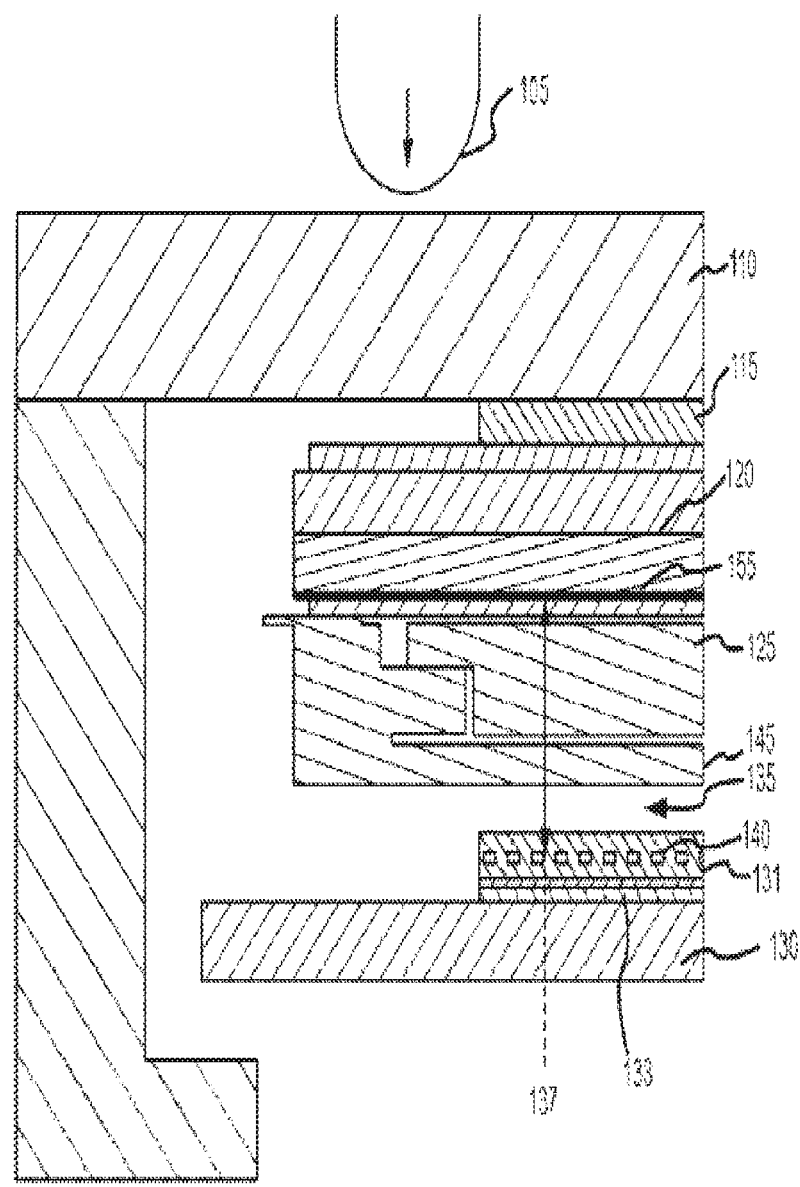
FIG. 2B is a partial side cut-away view of the example personal electronic device of FIG. 1 including another example capacitive force sensor, as described herein, cut along line 2-2.

The capacitive force sensing device will now be discussed in more detail. FIGS. 2A and 2B are partial cross-section views of the electronic device (an edge portion illustrating the layers within the example capacitive force sensor and display stack) taken along line 2-2 in FIG. 1.

With reference to FIG. 2A, in one embodiment, a user contacts personal electronics device 100, such as when a user's finger 105, or other object, applies force (shown with reference to an arrow in FIG. 2A), to a cover glass element 110, the input surface, or other element of the device. For example, as described herein, the user's finger 105 can apply force to the cover glass element 110 at one or more locations in which the cover glass element 110 also has a touch sensor (not shown), or can apply force to the cover glass element 110 at one or more locations in which the cover glass element 110 does not have a touch sensor.

In one embodiment, the cover glass element 110 includes a relatively translucent or transparent (in most locations) substance capable of isolating circuitry for the touch device from ambient objects. For example, glass, treated glass, plastic, diamond, sapphire, and other materials can serve as such substances. In one embodiment, the cover glass element 110 is positioned above the device circuits, including an adhesive layer 115. In some embodiments, the edge of the adhesive layer 115 may mark an edge of the visible portion of the display.

In one embodiment, the adhesive layer 115 is substantially translucent or transparent. This can have the effect of allowing a set of display circuits to provide a display to the user, without interference. In one embodiment, the adhesive layer 115 is positioned above a set of display circuits 120.

In one embodiment, the display circuits 120 provide a display to the user, such as a GUI or an application program display, although it should be appreciated that some portion of the display circuits 120 are dedicated to integrated circuitry that is typically not visible to a user and does not provide any output visible by a user. Such an area may be, for example, to the left of the edge of the adhesive layer 115 (with respect to the orientation of FIG. 3A). In one embodiment, the display circuits 120 are positioned above a back light unit (BLU) 125.

In one embodiment, the back light unit 125 provides a back light for the display circuits 120. A support structure 145 may support the back light unit 125 and/or the display 120.

In one embodiment, the device can include a compressible gap 135 or spacing layer that is part of a larger sensing gap 137 defining a distance between the two capacitive sensing elements 140a, 140b. For example, the compressible gap 135 can include an air gap, a gap at least partly filled with a compressible substance (such as a substance having a Poisson's ratio of less than about 0.48), or a gap at least partly filled with a compressible structure.

As shown in FIG. 2A, an applied force (shown with respect to the arrow) can cause the cover glass element 110 or other device element to exhibit surface flex. This can have the effect that one or more elements in the device are brought closer together in response to the applied force. As described herein, a capacitive force sensor detecting or measuring one or more capacitive changes can determine an amount and location of that applied force based on those capacitive changes. In short, a capacitive force sensor may include one or more capacitive sensing elements.

In one embodiment and returning to FIG. 2A, the compressible gap 135 or sensing gap can be positioned in one or more of several positions in the device. For some examples: (A) The compressible gap 135 can be positioned above the display circuits 120, such as below the cover glass element 110, below the adhesive layer 115, and above the display circuits 120; (B) the compressible gap 135 can be positioned below at least a portion of the display circuits 120, such as below a polarizer element, as described herein. In such cases, the polarizer can be a part of the display circuits; and (C) the compressible gap 135 can be positioned below the back light unit 125 and above the internal structural element 130, which may be, for example, the midplate of the personal electronics device. It should be appreciated that a compressible gap may be located elsewhere in the device, and so the foregoing are merely examples of locations.

In one embodiment, the force sensor can include two capacitor plates 140a and 140b, disposed to determine an amount of capacitance change in response to surface flex. The capacitor plates 140a and 140b can include either mutual capacitance or self-capacitance features, as described herein. In cases in which capacitor plates 140a and 140b includes mutual capacitance features, the capacitor plates 140a and 140b can be disposed in drive/sense rows/columns, as described in detail hereinbelow, with reference to FIG. 3. In cases in which capacitor plates 140a and 140b includes self capacitance features, one of capacitor plates 140a and 140b may be a shield plate, as illustrated by shielding plate 155 in FIG. 2B.

Thus, capacitor plates 140a and 140b may be arranged in a variety of configurations, including linearly, in an array, or at irregular intervals. References to a "capacitor plate" herein are generally meant to encompass multiple capacitive sensing elements in an appropriate configuration, as well.

Further, although certain figures (such as FIGS. 2A and 2B) depict the capacitive sensing element as terminating at an edge of a visible display, it may be appreciated that the capacitor plates may extend into a border region, beyond an edge of the visible display, to provide force sensing in such a region.

In some embodiments, the capacitor plates 140a and 140b can include at least portions that are substantially opaque or translucent or transparent, as described herein. In cases in which at least a portion of the capacitor plates 140a and 140b is positioned above the back light unit 125, those portions are substantially translucent or transparent.

Generally, in one embodiment approximately 100 grams of force applied to the front of the cover glass may cause the sensing gap 137 between elements 140a and 140b to reduce in dimension by approximately 1.6 micrometers. Likewise, an upward or outward force applied to the cover glass may cause the sensing gap 137 to increase in dimension. It should be appreciated that the exact ratio of force to change in sensing gap 137 may vary between embodiments, and the numbers provided herein are meant purely as one example.

It should also be appreciated that the sensing gap 137 may include intermediate elements between the sensing elements 140a and 140b; that is, the entire gap may not be solely air.

Regardless, as the sensing gap 137 decreases, the capacitive sensing elements move closer to one another and thus the capacitance measured between the elements 140a, 140b may increase. In a mutual capacitance system employing multiple planes of capacitive sensing elements, as shown in FIG. 2A, this change in the mutual capacitance may result from a change in the distance between two capacitive sensing elements, for example due to a surface flex of the cover glass or other surface on which a force is exerted. Accordingly, as the distance changes with the force exerted on the cover glass, the change in mutual capacitance may be correlated to a force exerted to create the change in distance/surface flex.

In one embodiment, the amount and location of surface flex can be distributed with respect to the surface of the device, such as with respect to a usable surface of the cover glass element 110, and can be responsive to one or more locations where applied force (such as by the user's finger) is presented to the surface of the device.

In one embodiment, the capacitance sensing element 140a and 140b can be integrated into a device circuit that is disposed for touch sensing. This would have the effect that circuits for detection and measurement of applied force can integrated together with circuits for detection of touch.

It should be appreciated that either of the capacitive sensing plates 140a or 140b may be replaced with a ground or shield layer. By replacing either of the capacitive sensing elements with a shield layer, the device may employ a self-capacitive force sensor. FIG. 2B illustrates such an embodiment. As shown, capacitive sensing plate 140 may be positioned at or adjacent internal structural element 130, which may be the midplate or another support structure that is relatively immobile with respect to a frame or enclosure of the electronic device. For example, the element may be placed on a graphite layer or other substrate 133 and/or a within flexible circuit 131, affixed to the midplate. It should be appreciated that the capacitive sensing elements need not be placed within a flexible circuit 131, although this is shown in FIG. 2B. In this example embodiment, the capacitive sensing elements of capacitor plate 140 may measure their capacitance with respect to the ground layer 155.

Forces exerted on the cover glass 110 will generally cause the display stack beneath the glass to move downward, at least to a small extent. Accordingly, distance between the ground layer 155 and capacitive sensing plate 140 (i.e. the gap width) may decrease, which in turn may cause the capacitance measured by the capacitive sensing elements to increase. Likewise, as a force is removed from the cover glass, the ground layer 155 may move away from the capacitive sensing plate 140 and so the measured capacitance may decrease. These changes in capacitance are generally due to the force exerted on the cover glass, for example by a user's finger 105.

In addition, the ground layer 155 may shield the capacitive sensing element from external noise, cross-talk and parasitic capacitances. The ground layer may be passive or actively driven to a voltage, depending on the embodiment.

In other embodiments, the positions of the ground layer 155 and the capacitive sensing plate 140 may be reversed, such that a force exerted on the cover glass may move the capacitive sensing element while the ground plane remains immobile. Otherwise, operation of such an embodiment is generally the same as has been previously described.

Although embodiments have been discussed with respect to a display and a cover glass, it should be appreciated that alternative embodiments may omit one or both elements. For example, the cover glass may be replaced by a trackpad surface and the display stack may be omitted, while the ground layer is affixed to an underside of the trackpad surface. Such an embodiment would operate to measure (or more precisely, estimate) force exerted against the surface of the trackpad.

Arrangement of Capacitive Sensing Elements.

Generally, the capacitive sensing elements of the capacitive plates (140a and 140b in FIG. 2A and 140 in FIG. 2B) may be arranged in an array (here, shown as a grid) of any desired shape and/or size. Each capacitive sensing element may be connected by its own dedicated signal trace to an integrated circuit that receives the output of the capacitive sensing element and may, for example process that output in order to correlate it to a force exerted on a cover glass or other surface. The integrated circuit may include one or more processing units to perform such operations, for example. It should be appreciated that the integrated circuit may be located remotely from the capacitive sensing array and may be displaced therefrom substantially along any axis.

The array of capacitive sensing elements may be placed in the position or positions shown by capacitive sensing plates 140a and 140b in FIG. 2A or capacitive sensing plate 140 in FIG. 2B, or anywhere else a capacitive sensing plate is shown or discussed herein.

Each capacitive sensing element of example capacitive force sensors, as described herein, effectively functions to sense a change in capacitance due to a surface flex directly above its area. As previously mentioned, this change in capacitance may be correlated to a force, which in turn may be used as an input for a personal electronic device. As may be understood from Equation 1, the resolution of the array to a force may be varied by varying the effective gap width between capacitive sensing plates 140, varying the areal size of the elements, or both. It should be appreciated that there is no requirement that the effective gap width and/or the areal size of the elements remain constant in any embodiment. Thus, some embodiments may have regions where the capacitive sensing elements are smaller and/or have a different effective gap width than in other regions. As noted above, the effective gap width may change if the capacitor plates are positioned closer together or farther apart, or the composition of layers within the gap changes. This may provide a surface for a personal electronic device that has variable resolution of force across its area.

Force Sensing Elements

FIG. 5 shows a first conceptual drawing of an alternative array of force sensing elements, which may be used as (or in place of) capacitive sensing plates 140a, 140b.

ROWS AND COLUMNS. In one embodiment, a force sensitive device and system can include a set of drive columns 305 and a set of sense rows 310. In alternative embodiments, the columns may be sensed and the rows may be driven. The drive columns 305 are coupled to one or more drive signals, such as from a drive circuit 315. For example, the drive circuit 315 can include a timed circuit that selects each drive column 305 in turn and drives that column for a relatively short period of time, eventually selecting each such drive column 305 in a round-robin fashion. Similarly, the sense rows 310 are coupled to one or more sense receivers, such as a sense circuit 320. For example, the sense circuit 320 can also include a timed circuit that selects each sense row 310 in turn and senses that row for a relatively short period of time, eventually selecting each such sense row 310 in a round-robin fashion.

This can have the effect that each intersection 325 of row and column (one example of a "force sensing element" 325) is selected in turn for a relatively short period of time, relatively rapidly. For example, when each force sensing element 325 is selected sufficiently rapidly that a user cannot discern the time when they are selected, it can appear to that user that all force sensing elements 325 are sensed essentially simultaneously.

It should be appreciated that alternative embodiments may drive multiple force sensing elements simultaneously as opposed to sequentially. Further, different force sensing elements 325 may be driven at different frequencies and/or phases, or both, in order to permit multiple elements to be driven at the same time and minimize cross-talk or other interference between sensing elements.

In one embodiment, the force sensitive device and system determines an amount of force applied to that individual force sensing element 325. This can have the effect of producing a map of applied force at each individual force sensing element 325, sometimes herein called a "heat map". For example, the heat map of applied force can show both the amount of applied force, but also the location at which that force is applied.

For example, an amount of applied force Fa at an applied location [X, Y] can provide a substantial amount of sensed force Fs, even a substantial distance away from the applied location [Xa, Ya], such as at a sensed location [Xs, Ys]. This can be due to substantial surface flex being detected at the sensed location [Xs, Ys]. In one embodiment, a force sensitive device can determine the applied force Fa at the applied location [Xa, Ya] in response to the heat map of sensed forces Fs at sensed locations [Xs, Ys]. For example, the force sensitive device can determine a set of local maxima of sensed forces Fs at sensed locations [Xs, Ys], and conclude that the local maximum of sensed forces Fs is also the location and amount of applied force Fa.

In alternative embodiments, one or more touch sensors can also assist in determining a location at which force is applied, in response to determining a location of touch. The touch sensors may detect a user touch on an input surface of an electronic device, for example. Concurrently or additionally, one or more force sensors may determine that a force has been applied to the input surface. Insofar as an overall force is known and a location of a touch (or touches, in the case of multitouch-capable touch sensors), a force may be assigned to a particular location on an input surface corresponding to a touch. In the event that a single touch is detected, the force may be assigned completely to the location of the touch. If multiple touch locations are detected, then the force may be weighted and assigned to the various touch locations through a variety of manners. As one example, the sensed force may be greater in one portion of the input surface than in another. If a touch is near this portion, a majority of a force may be assigned to that particular touch location. A centroid of the applied and sensed forces may also be determined if a number of touch locations is known, insofar as an embodiment may presume that at least some amount of force is exerted at each touched location. The centroid may be used to assign force to the various touch locations, for example based on the touch locations' distances from the centroid. Yet other manners of associating force with one or more touch locations, as measured by one or more touch sensors, may be employed by alternative embodiments.

Measured Capacitance Versus Actual Capacitance

As discussed above, the capacitance of individual example capacitive sensing elements may be correlated to a change in the gap width between the capacitor plates of the capacitive sensing element, using Equation 2. Additionally, the change in the gap width between the capacitor plates of the capacitive sensing element is a monotonic function of the applied force. In some example embodiments, as described herein, the materials of the flexible element (for example, the cover glass 110, adhesive layer 115, and display stack 120 in FIGS. 2A and 2B) may selected and shaped such that the applied force is approximately proportional to the gap width change across an expected range of applied forces; however, this is not necessary for changes in capacitance of the capacitive sensing element to be correlated to applied force (albeit a, possibly nonlinearly, scaled applied force), using Equation 2.

It is noted, however in example embodiments described herein, that the actual capacitance of a capacitive sensing element is not necessarily same as the measured 'capacitance value' that is used by the processor in the personal electronics device to determine the applied force. In many example embodiments, the measured capacitance value may be proportional, but not equal, to the actual capacitance of the capacitive sensing element, i.e. there may be a capacitive sensor gain associated with the capacitive sensing element. This capacitive sensor gain may be due to preamplifier stages or other circuitry involved with determining the measured capacitance value. Additionally, there may be a capacitive sensor offset, so that if the graph representing the measured capacitance value versus the actual capacitance is extended to an actual capacitance of zero there remains a non-zero measured capacitance value. This capacitive sensor offset, and the capacitive sensor gain, may be useful to scale the measured capacitance value such that, for all anticipated actual capacitances, it remains within a predetermined range of capacitance values, thus simplifying processor requirements. Equation 3 illustrates this example relationship between the measured capacitance value and the actual capacitance of an example capacitive sensing element:

$$C_{Meas} = K_{off} + K_{gain} C_{Act},$$ Equation 3 where $C_{Meas}$ is the measured capacitance value of the capacitive sensing element, $K_{off}$ is the capacitive sensor offset, $K_{gain}$ is the capacitive sensor gain, and $C_{Act}$ is the actual capacitance of the capacitive sensing element. Furthermore, it is noted that this linear relationship between the actual capacitance of a capacitive sensing element and its measure capacitance value may be accurate only within a predetermined range; however, the circuitry of the example capacitive force sensor may be designed so that this predetermined range is at least as broad as the range of anticipated actual capacitances.

Therefore, to perform accurate force measurements using example capacitive force sensors, as described herein, it may be useful to know the capacitive sensor gain and the capacitive sensor offset, in addition to the effective separation of the capacitor plates at zero applied force. Expected values for the capacitive sensor gain and the capacitive sensor offset may be specified during design of the circuitry associated example capacitive force sensors, as described herein; however, maintaining tight tolerances on these specifications may be impractical during mass production of personal electronics devices including example capacitive force sensors, as described herein. And like the effective separation, the capacitive sensor gain and the capacitive sensor offset may vary from one capacitive force sensor to the next, or even one capacitive sensing element to the next within a single capacitive force sensor. Thus, for complete characterization of example capacitive force sensors, as described herein, systems and methods to determine the capacitive sensor gain, the capacitive sensor offset, and the effective separation of the capacitor plates at zero applied force may prove useful. Example embodiments, as described herein, include such systems and methods.

Figure 4:
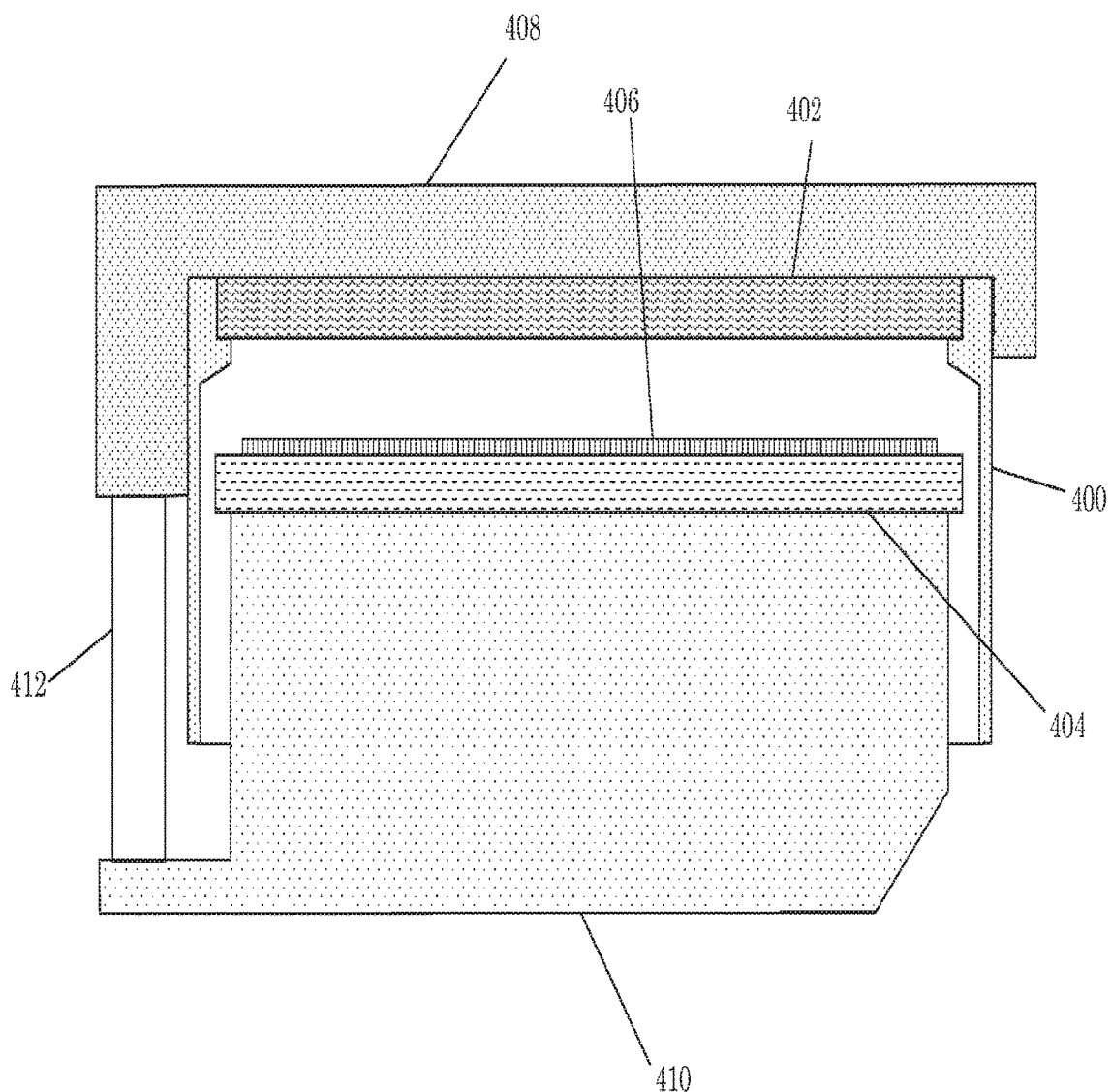
FIG. 4 is a simplified side cut-away view of components of a personal electronic device mounted in an example capacitive force sensor characterization system, as described herein.

FIG. 4 illustrates features of an example capacitive force sensor characterization system for calibrating a capacitive force sensor included in a personal electronic device, as described herein. As discussed in detail above, the example capacitive force sensor includes a first capacitor plate, which is coupled to flexible element 402 of the personal electronic device, and a second capacitor plate 406 coupled to internal structural member 404 of the personal electronic device. It is noted that the example capacitive force sensor characterization system illustrated in FIG. 4 is intended for use during manufacture of the personal electronic device. Thus, flexible element 402 may be coupled to housing 400 of the personal electronic device during the characterization procedure, while internal structural member 404 is not coupled to the housing during characterization, as shown in FIG. 4. Alternatively, internal structural member 404 may be coupled to housing 400, while flexible element 402 is not coupled to the housing during characterization. It is also contemplated that example capacitive force sensor characterization systems, as described herein, may be designed such that neither flexible element 402 nor internal structural member 404 is coupled to the housing during the characterization procedure. The issue is for internal structural member 404 and flexible element 402 to be capable of relative movement during characterization; however, it may be useful for flexible element 402 to be coupled to housing 400 during characterization to help reduce any possible deformation of flexible element 402 caused by direct coupling of flexible element 402 into an element fixture.

The capacitive force sensor characterization system includes: housing fixture 408; member fixture 410; positioner 412 coupled to at least one of housing fixture 408 or member fixture 410; a position sensor (not shown); control circuitry (not shown) electrically coupled to the positioner to provide the drive signal to the positioner; and a processor (not shown) electrically coupled to the first capacitor plate, the second capacitor plate, and the position sensor.

Housing fixture 408 is adapted to hold housing 400 of the personal electronic device. Flexible element 402 may be fixedly coupled to housing 400, as shown in FIG. 4. The coupling between housing fixture 408 and housing 400 may be mechanical, or housing fixture 408 may include a vacuum chuck, or an adhesive surface adapted to repeatable hold and release a component, such as a 'gecko skin' integrated adhesive, to hold housing 400 in place, or other means for coupling and decoupling the housing from the fixture, as long as housing 400 may be held by housing fixture 408 such that there is substantially no applied force on flexible element 402 that might cause it to deform, and thus deform the first capacitor plate of the example capacitive force sensor, during characterization.

In a case in which flexible element 402 is not coupled to housing 400 during characterization, one skilled in the art may understand that flexible element 402 may be held in an element fixture replacing housing fixture 408. The element fixture may usefully include a coupling means designed to substantially prevent deformation of flexible element 402 during characterization. It is noted that in such example embodiments it may also be useful for the coupling of flexible element 402 to housing 400 to also be designed to substantially prevent deformation of flexible element 402.

Member fixture 410 adapted to hold internal structural member 404 of the personal electronic device. Internal structural member 404 may be the midplate, or another internal structure of the personal electronic device to which second capacitor plate 406 is coupled. Internal structural member 404 may be fairly rigid and largely prevent deformation of second capacitor plate 406 during characterization.

Member fixture 410 may include a vacuum chuck, or an adhesive surface, to hold internal structural member 404 in place, as shown in FIG. 4. Alternatively, internal structural member 404 may be mechanically coupled to member fixture 410, or other means for coupling and decoupling the internal structural member 404 from the fixture may be used, as long as internal structural member 404 may be held by member fixture 410 such that second capacitor plate 406 is not substantially deformed during characterization.

In a case in which internal structural member 404 is coupled to housing 400 during characterization, member fixture 410 may be coupled directly to internal structural member 404 or it may be coupled to housing 400.

Housing fixture 408 and member fixture 410 may be arranged such that the first capacitor plate (in flexible element 402) and the second capacitor plate 406 of the example capacitive force sensor may be held substantially parallel when housing 400 is mounted in housing fixture 408 and internal structural member 404 is mounted in member fixture 410. Additionally, when housing 400 is mounted in housing fixture 408 and internal structural member 404 is mounted in member fixture 410 it may be useful for the separation between the capacitor plates to be similar to their anticipated separation in the completed personal electronics device, which may be on the order of microns to 100's of microns.

As illustrated in FIG. 4, housing fixture 408 and member fixture 410 are coupled together by positioner 412. In the illustrated example configuration one of housing fixture 408 or member fixture 410 may include, or be directly coupled to, a frame or test platform (not shown) to provide additional stability. In alternative example embodiments, one of housing fixture 408 or member fixture 410 may include, or be directly coupled to, a frame, or test platform, and positioner 412 may be coupled between the frame and the other one of housing fixture 408 or member fixture 410; positioner 412 may include at least one linear actuator coupled between a frame, or test platform, and housing fixture 408 and at least one linear actuator coupled between the frame, or test platform, and member fixture 410.

Positioner 412, which is shown as a single linear actuator for clarity in FIG. 4, is adapted to precisely vary the gap width between the first capacitor plate (in flexible element 402) and second capacitor plate 406 by moving one of housing fixture 408 or member fixture 410 relative to the other in response to a drive signal from the control circuitry. It is contemplated that may include three of more linear actuators to allow precise control of relative tilt angles between housing fixture 408 and member fixture 410, as well as providing translational motion. The linear actuator(s) may include solenoids, pneumatic drives, stepper motors and linear motion stages, inchworm drives, or other linear actuators having sufficient precision.

The position sensor is adapted to measure differences in the gap width between the first capacitor plate and the second capacitor plate relative to the initial gap width.

Directly measuring the gap width may be impractical, particularly as part of the mass production of the personal electronic device. However, the position sensor may be adapted to measure these gap width differences by measuring the relative positions of housing fixture 408 and member fixture 410 in their initial positions and then following each movement of the fixtures by positioner 412 during the test procedure. The position sensor may include a precision laser distance sensor, or other precision position sensor, fixedly coupled to one of the housing fixture 408 and member fixture 410 and adapted to measure the distance to a predetermined point on the other of fixtures. Alternatively, the position sensor may be fixedly coupled to a frame of the system separate from the fixtures and adapted to measure the distance to a predetermined point(s) on one, or both, of the housing fixture 408 and member fixture 410. In another example embodiment the may position sensor include a precision capacitive distance sensor coupled to each linear actuator of positioner 412.

Additionally, the position sensor may include at least three sensor elements, each adapted to measure local differences in the gap width between the first capacitor plate and the second capacitor plate by measure the change in distance between the sensor element and a predetermine point on one of the fixtures. The three or more local differences in the gap width measured in this way may be used to determine whether any change in the tilt angle between the capacitor plate has occurs during the variation in gap width.

Figure 5A:
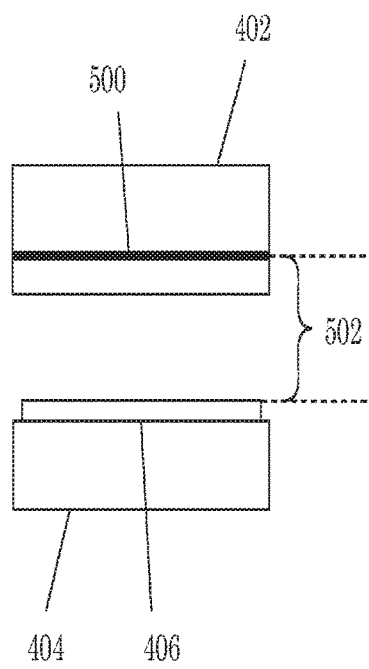
FIG. 5A is a conceptual drawing illustrating an initial positioning of components of a capacitive force sensor during an example characterization procedure, as described herein.
Figure 5B:
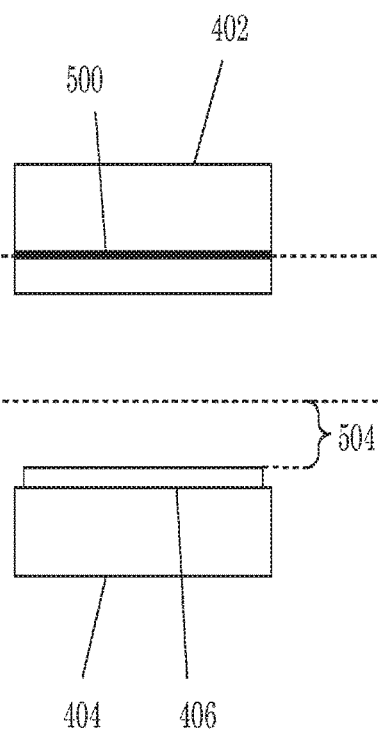
FIG. 5B is a conceptual drawing illustrating a first test positioning of components of the capacitive force sensor during the example characterization procedure of FIG. 5A.
Figure 5C:
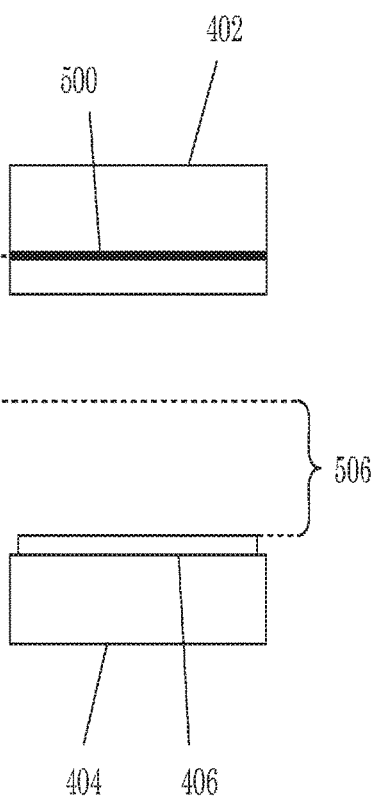
FIG. 5C is a conceptual drawing illustrating a second test positioning of components of the capacitive force sensor during the example characterization procedure of FIGS. 5A and 5B.

The control circuitry is adapted to generate the drive signal following a test procedure such that, in response to the drive signal, positioner 412 varies the gap width between the capacitor plates of the capacitive force sensor from the initial gap width to at least two test gap widths. FIGS. 5A-C illustrate the gap width variations of an example test procedure as described herein. FIG. 5A illustrates initial gap width 502 between first capacitor plate 500 (shown as coupled within flexible member 402) and second capacitor plate 406 (shown coupled to a surface of internal structural member 404). It is noted that initial gap width 502 is not equal to the initial effective separation of the capacitor plates, and that the example capacitive force sensor characterization system of FIG. 4 does not measure initial gap width 502. FIG. 5B illustrates the position of the capacitor plates after the first gap width variation of the example test procedure, showing first test difference 504 in the gap width. FIG. 5C illustrates the position of the capacitor plates after the second gap width variation of the example test procedure, and shows second test difference 506 in the gap width.

The control circuitry may be electrically coupled to the position sensor and/or the processor to create a feedback circuit for generating the drive signal. This may allow for improved control of the position so that the actual test gap differences may be approximately equals to a set of preselected test gap differences, and in an example embodiment including at least three sensor elements and at least three linear actuators, this may allow for control of the tilt angle between the capacitor plate by providing slight feedback corrections to the drive signal to the individual linear actuators until the local differences in the gap width are approximately equal.

The processor is adapted to determine the capacitive sensor gain, the capacitive sensor offset, and the initial effective separation between the first capacitor plate and the second capacitor plate. The processor may include special purpose circuitry and/or a general purpose processor programmed to perform the timing, measurement, and computational steps to accomplish these determinations.

The processor is coupled to the first capacitor plate and the second capacitor plate and adapted to measure their initial capacitance value at the initial gap width between the capacitor plates and their test capacitance values after each gap width variation. As described in detail above, the first capacitor plate and the second capacitor plate may be designed to form an array of capacitive sensing elements. And the characteristics of each of these capacitive sensing elements may be different. Therefore, it may be useful for the processor to be adapted to measure the initial capacitance value and the test capacitance values for each of these capacitive sensing elements.

The processor may also be coupled to the control circuitry to instruct the control circuitry when to vary the gap width during the test procedure. The processor is further coupled to the position sensor to receive position information from the position sensor and adapted to determine the test gap width differences from this position information.

The processor is further adapted to calculate the capacitive sensor gain, the capacitive sensor offset, and the initial effective separation between the capacitor plates based on the initial capacitance value, the test capacitance values, and the corresponding test differences in the gap width between the capacitor plates. In an example embodiment, the processor may calculate the capacitive sensor gain, the capacitive sensor offset and the initial effective separation using Equation 4, which may be derived by combining Equations 2 and 3, to generate a system of simultaneous equations for the initial and test measurements:

$$C_N = K_{off} + (K_{gain}/(z_{eff} + \Delta z_N)) \quad \text{Equation 4}$$

where N in an integer that runs from 0 to the number gap width variations in the test procedure, $C_0$ is the initial capacitance value, $C_N$ is the Nth test capacitance value for N greater than 0, $K_{off}$ is the capacitive sensor offset, $K_{gain}$ is the capacitive sensor gain, $z_{eff}$ is the initial effective separation between the capacitor plates, $\Delta z_0 = 0$ (i.e. the initial gap width difference is 0), and $\Delta z_N$ is the Nth test gap width difference between the capacitor plates for N greater than 0. It is noted that there are three unknowns in the resulting system of simultaneous equations, and thus the system may be overspecified if the test procedure includes more than two gap width variations. However, one skilled in the art may understand that there are many numeric computational methods that may take advantage of such overspecified systems of equations.

In example embodiments in which the first capacitor plate and the second capacitor plate are designed to form an array of capacitive sensing elements, it may be useful for the processor to be adapted to determine the capacitive sensor gain, the capacitive sensor offset and the initial effective separation of each capacitive sensing element based on the initial capacitance value of the capacitive sensing element, the test capacitance values of the capacitive sensing element, and the corresponding test differences in the gap width between the capacitor plates. It is noted that while the initial effective separation of each capacitive sensing element may vary across the array, the test differences in the gap width are the same for each capacitive sensing element. In such example embodiments, the processor may calculate the capacitive sensor gain, the capacitive sensor offset and the initial effective separation of each capacitive sensing element separately using Equation 4.

FIG. 6 is a flowchart of an example method of characterizing a capacitive force sensor included in a personal electronic device. The example capacitive force sensor includes a first capacitor plate coupled to a flexible element of the personal electronic device and a second capacitor plate coupled to an internal structural member of the personal electronic device. The flexible element may be coupled to the housing of the personal electronic device. It is noted that this example method may be performed using one of the example systems of FIG. 4 described in detail above.

The housing of the personal electronic device is mounted in a housing fixture, step 600, and the internal structural member is mounted in a member fixture, step 602, such that the first capacitor plate and the second capacitor plate of the capacitive force sensor are substantially parallel and separated by an initial gap width. It may be useful for the initial gap width (and the test gap widths) between the first capacitor plate and the second capacitor plate of the capacitive force sensor may be selected to be within a predetermined range of gap widths of the completed capacitive force sensor. It is noted that, while test differences in the gap width are measured precisely in example embodiments described herein, it is not necessary for either the initial gap width, or any of the test gap widths, between the first capacitor plate and the second capacitor plate of the capacitive force sensor to be measured precisely. Thus, this possibly useful selection of the gap widths used in example characterization systems and methods described herein to be within a predetermined range of gap widths of the completed capacitive force sensor may only be approximate.

An initial capacitance value between the first capacitor plate and the second capacitor plate of the capacitive force sensor is measured, step 604. As noted above in the example embodiments of FIG. 4, the first and second capacitor plates may be designed to form an array of capacitive sensing elements, and in such example embodiments, an initial capacitance value may be measured for each capacitive sensing element.

The housing fixture or the member fixture is moved, such that the first capacitor plate and the second capacitor plate of the capacitive force sensor are substantially parallel and separated by a test gap width, step 606. The gap width difference between the initial gap width and the test gap width is then determined, step 608. This movement and determination of the gap width difference may be accomplished as described above with reference to the example embodiments of FIG. 4.

A test capacitance value between the first capacitor plate and the second capacitor plate of the capacitive force sensor is measured at the test gap width, step 610. Then steps 606, 608, and 610 are repeated predetermined number of times, though at least once. Once it is determined that these steps have been performed the predetermined number of times, step 612, a capacitive sensor gain, a capacitive sensor offset, and an initial effective separation between the capacitor plates is calculated, step 614, based on the initial capacitance value, the test capacitance values, and the corresponding test gap width differences between the capacitor plates. As described in detail above with reference to the example embodiments of FIG. 4, these calculations may be performed by generate a system of simultaneous equations using Equation 4, and solving this system of simultaneous equations, possibly utilize numeric computational techniques if steps 606, 608, and 610 were repeated more than once. If the capacitor plates may be designed to form an array of capacitive sensing elements, Equation 4 may be used to generate a system of simultaneous equations for each capacitive sensing element.

Once the capacitive sensor gain, the capacitive sensor offset, and the initial effective separation between the capacitor plates has been determined in step 614, it may be useful to complete the assembly of the capacitive force sensor before removing the housing and internal structural member from the housing and member fixtures, respectively. The housing and member fixtures may be moved back to their initial position, i.e. to a gap width difference of zero. As noted above, although the initial gap width may not be measured precisely in example embodiments describe herein, the gap width difference is measured precisely in example embodiments describe herein, and the initial effective separation between the capacitor plates corresponding to the initial gap width may be calculated precisely in step 614. Thus, the initial position of the housing and member fixtures provides a useful reference point.

In this position, the internal structural member of the personal electronic device may be fixedly coupled to the housing of the personal electronic device, after which the internal structural member may be released from the member fixture.

To compensate for any imprecision in the repositioning of the housing and member fixture, a calibration capacitance value, with zero applied force on the flexible element of the personal electronic device, may be measured between the capacitor plates of the now assembled capacitive force sensor. A calibrated effective separation between the capacitor plates with zero applied force may be calculated based on the capacitive sensor gain, the capacitive sensor offset, and the calibration capacitance value, using Equation 4. If the capacitor plates may be designed to form an array of capacitive sensing elements, these calibration steps may be performed for each capacitive sensing element, or they may be performed for a subset of the capacitive sensing elements and extrapolated to the remaining capacitive sensing elements.

Figure 7:
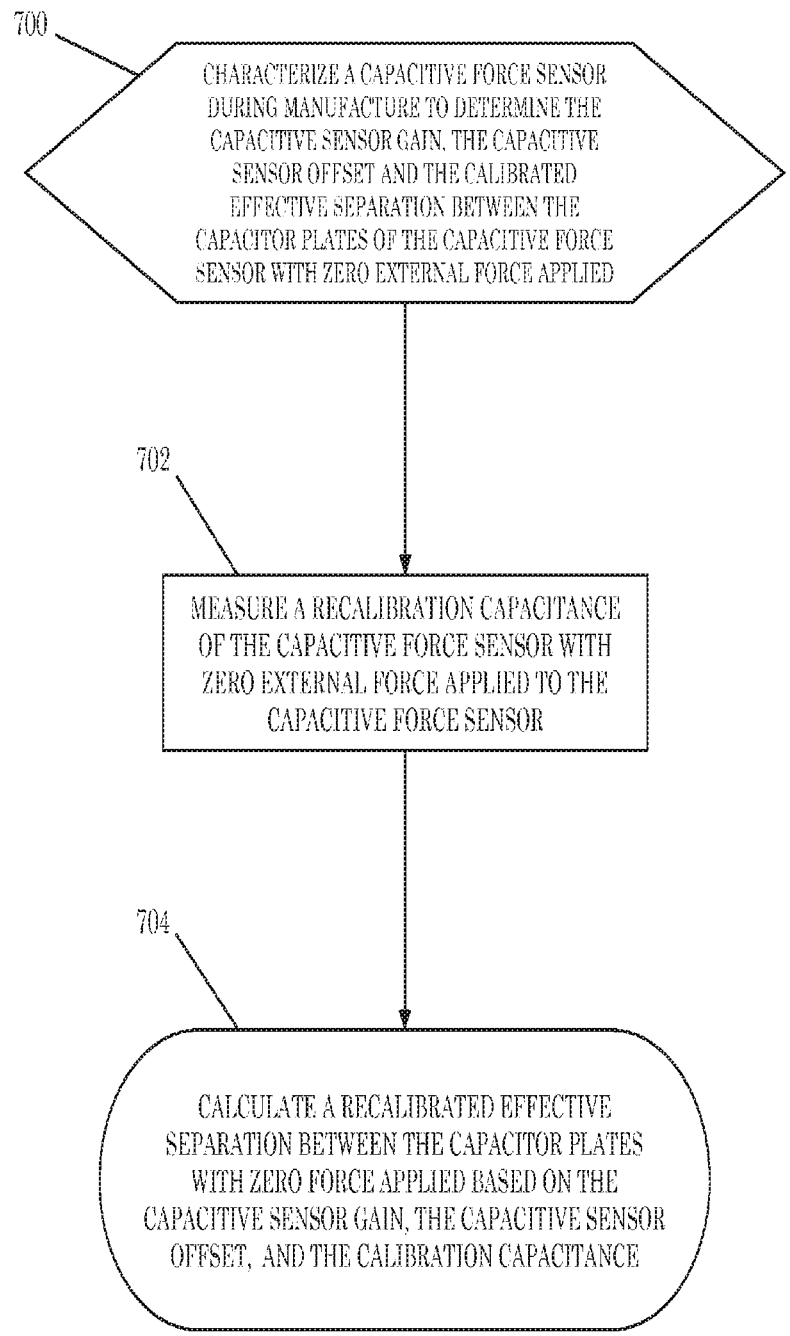
FIG. 7 is a flowchart illustrating an example method of recalibrating a capacitive force sensor, as described herein.

FIG. 7 illustrates an example method of recalibrating a capacitive force sensor that has previously been characterized, step 700, to determine the capacitive sensor gain, the capacitive sensor offset, and the calibrated effective separation between its capacitor plates with zero applied force, such as by the example characterization method of FIG. 5.

A recalibration capacitance value is measured between the capacitor plates of the capacitive force sensor, step 702. This recalibration capacitance value is measured with zero applied force on the capacitive force sensor.

A recalibrated effective separation between the capacitor plates with zero applied force is the calculated, step 704, based on the capacitive sensor gain, the capacitive sensor offset, and the recalibration capacitance value between the capacitor plates of the capacitive force sensor. This calculation may also be performed using Equation 4. As in the example initial calibration procedure described above with reference to FIG. 4, if the capacitor plates may be designed to form an array of capacitive sensing elements, these calibration steps may be performed for each capacitive sensing element, or they may be performed for a subset of the capacitive sensing elements and extrapolated to the remaining capacitive sensing elements.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular embodiments. Functionality may be separated or combined in procedures differently in various embodiments of the disclosure or described with different terminology. These and other variations, modifications, additions, and improvements may fall within the scope of the disclosure as defined in the claims that follow.

The invention claimed is:

1. A capacitive force sensor characterization system for calibrating a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device and the internal structural member not being coupled to the housing during characterization, the capacitive force sensor characterization system comprising:
   a housing fixture adapted to hold the housing of the personal electronic device;
   a member fixture adapted to hold the internal structural member of the personal electronic device;
   a positioner coupled between the housing fixture and the member fixture, the positioner adapted to vary a gap width between the first capacitor plate and the second capacitor plate in response to a drive signal;
   a position sensor adapted to measure differences in the gap width between the first capacitor plate and the second capacitor plate relative to an initial gap width;
   control circuitry electrically coupled to the positioner to provide the drive signal to the positioner, the control circuitry adapted to generate the drive signal following a test procedure such that, in response to the drive signal, the positioner varies the gap width between the first capacitor plate and the second capacitor plate from the initial gap width to at least two test gap widths; and
   a processor electrically coupled to the first capacitor plate, the second capacitor plate, and the position sensor, the processor adapted to determine:
   a capacitive sensor gain;
   a capacitive sensor offset; and an
   initial effective separation between the first capacitor plate and the second capacitor plate.

2. A capacitive force sensor characterization system for calibrating a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device and the internal structural member not being coupled to the housing during characterization, the capacitive force sensor characterization system comprising:
   a housing fixture adapted to hold the housing of the personal electronic device;
   a member fixture adapted to hold the internal structural member of the personal electronic device;
   a positioner coupled to at least one of the housing fixture or the member fixture, the positioner adapted to vary a gap width between the first capacitor plate and the second capacitor plate in response to a drive signal;
   a position sensor adapted to measure differences in the gap width between the first capacitor plate and the second capacitor plate relative to an initial gap width;
   control circuitry electrically coupled to the positioner to provide the drive signal to the positioner, the control circuitry adapted to generate the drive signal following a test procedure such that, in response to the drive signal, the positioner varies the gap width between the first capacitor plate and the second capacitor plate from the initial gap width to at least two test gap widths;
   a frame; and
   a processor electrically coupled to the first capacitor plate, the second capacitor plate, and the position sensor, the processor adapted to determine:
   a capacitive sensor gain;
   a capacitive sensor offset; and an
   initial effective separation between the first capacitor plate and the second capacitor plate;
   wherein:
   one of the housing fixture or the member fixture is fixedly coupled to the frame; and
   the positioner is coupled between the frame and one of the housing fixture or the member fixture which is not fixed coupled to the frame.

3. The capacitive force sensor characterization system of claim 1, wherein the positioner is coupled between the housing fixture and the member fixture.

4. The capacitive force sensor characterization system of claim 1, wherein:
   the position sensor is further coupled to the control circuitry and is further adapted to provide position information to the processor, the position information including a test difference in the gap width between the first capacitor plate and the second capacitor plate corresponding to each test gap width; and
   the processor is further adapted to:
   measure an initial capacitance value between the first capacitor plate and the second capacitor plate at the initial gap width between the first capacitor plate and the second capacitor plate;
   measure a test capacitance value between the first capacitor plate and the second capacitor plate corresponding to each test gap width between the first capacitor plate and the second capacitor plate; and
   determine the capacitive sensor gain, the capacitive sensor offset and the initial effective separation between the first capacitor plate and the second capacitor plate based on the initial capacitance value, the test capacitance values, and the corresponding test differences in the gap width between the first capacitor plate and the second capacitor plate.

5. The capacitive force sensor characterization system of claim 4, wherein:
   the position sensor includes at least three sensor elements, arranged such that the at least three sensor elements may provide at least three local differences in the gap width between the first capacitor plate and the second capacitor plate;
   the position sensor is further adapted to provide control information to the control circuitry, the control information includes the at least three local differences in the gap width;
   the control circuitry is further adapted to generate the drive signal based on control information such that, following each variation of the gap width in the test procedure, the at least three local differences in the gap width are substantially equal, thereby substantially maintaining a relatively tilt angle between the first capacitor plate and the second capacitor plate.

6. The capacitive force sensor characterization system of claim 5, wherein:
   the positioner includes at least three linear actuators; and
   the at least three linear actuators are coupled to the at least one of the housing fixture or the member fixture in a configuration such that the gap width between the first capacitor plate and the second capacitor plate is varied in response to the drive signal while substantially maintaining the relative tilt angle between the first capacitor plate and the second capacitor plate.

7. The capacitive force sensor characterization system of claim 6, wherein each of the at least three sensor elements of the position sensor includes at least one of:
   a precision laser distance sensor; or
   a precision capacitive distance sensor coupled to one of the at least three linear actuators.

8. The capacitive force sensor characterization system of claim 1, wherein:
   the position sensor is further coupled to the control circuitry and is further adapted to provide position information to the processor, the position information including a test difference in the gap width between the first capacitor plate and the second capacitor plate corresponding to each test gap width;
   the first capacitor plate and the second capacitor plate are designed to form an array of capacitive sensing elements; and
   the processor is further adapted to, for each capacitive sensor element in the array of capacitive sensing elements:
   measure an initial capacitance value of the capacitive sensing element at the initial gap width between the first capacitor plate and the second capacitor plate;
   measure a test capacitance value of the capacitive sensing element corresponding to each test gap width between the first capacitor plate and the second capacitor plate; and
   determine the capacitive sensor gain, the capacitive sensor offset and the initial effective separation of the capacitive sensing element based on the initial capacitance value of the capacitive sensing element, the test capacitance values of the capacitive sensing element, and the corresponding test differences in the gap width between the first capacitor plate and the second capacitor plate.

9. A method of characterizing a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device, the method comprising:
   a) mounting the housing of the personal electronic device in a housing fixture;
   b) mounting the internal structural member in a member fixture such that the first capacitor plate and the second capacitor plate of the capacitive force sensor are substantially parallel and separated by an initial gap width;
   c) measuring an initial capacitance value between the first capacitor plate and the second capacitor plate of the capacitive force sensor;
   d) moving one of the housing fixture or the member fixture, such that the first capacitor plate and the second capacitor plate of the capacitive force sensor are substantially parallel and separated by a test gap width;
   e) determining a gap width difference between the initial gap width and the test gap width;
   f) measuring a test capacitance value between the first capacitor plate and the second capacitor plate of the capacitive force sensor;
   g) repeating steps (d), (e), and (f) a predetermined number of times; and h) calculating a capacitive sensor gain, a capacitive sensor offset and an initial effective separation between the first capacitor plate and the second capacitor plate based on the initial capacitance value, the test capacitance values, and the corresponding test gap width differences between the first capacitor plate and the second capacitor plate; wherein:
   the housing fixture and the member fixture are coupled to a test platform at least during steps (c)-(g); and
   determining the gap width difference between the initial gap width and the test gap width in step (e) includes measuring a distance moved by at least one of the housing fixture or the member fixture in step (d) relative to a position sensor coupled to the test platform.

10. The method of claim 9, wherein the initial gap width and the test gap widths between the first capacitor plate and the second capacitor plate of the capacitive force sensor are selected to be within a predetermined range of gap widths of the completed capacitive force sensor.

11. The method of claim 9, wherein:
   the housing fixture is fixedly coupled to the test platform at least during steps (b)-(g);
   the member fixture is slidably coupled to one of the housing fixture or the test platform at least during steps (c)-(g);
   the position sensor is fixedly coupled to one of the housing fixture or the test platform;
   mounting the internal structural member in the member fixture in step (b) includes determining an initial position of the member fixture relative to the position sensor; and
   determining the gap width difference between the initial gap width and the test gap width in step (e) includes measuring a distance moved by the housing fixture in step (d) as measured from the initial position relative to the position sensor.

12. The method of claim 11, wherein:
   the position sensor includes at least three sensor elements;
   at least three linear actuators are coupled between the member fixture and one of the housing fixture or the test platform;
   mounting the internal structural member in the member fixture in step (b) includes, for each of the at least three sensor elements, measuring a position of a corresponding measurement feature of the member fixture relative to the sensor element, the initial position being an average of the at least three measured positions;
   moving one of the housing fixture or the member fixture, such that the first capacitor plate and the second capacitor plate of the capacitive force sensor are substantially parallel in step (d) includes:
   d1) actuating each of the at least three linear actuators to move the member fixture relative to the housing fixture;
   d2) for each sensor element, measuring a distance, relative to the sensor element, moved by the corresponding measurement feature of the member fixture as measured from the position measured by the sensor element in step (b); and
   d3) if the at least three distances measured in step (d2) are not substantially equal, actuating one or more of the at least three linear actuators, and repeating steps (d2) and (d3); and
   determining the gap width difference between the initial gap width and the test gap width in step (e) includes averaging the at least three distances measured in step (d).

13. The method of claim 9, wherein:
the member fixture is fixedly coupled to the test platform at least during steps (c)-(g);
the housing fixture is slidably coupled to one of the member fixture or the test platform at least during steps (c)-(g);
the position sensor is fixedly coupled to one of the member fixture or the test platform;
mounting the housing in the housing fixture in step (a) includes determining an initial position of the housing fixture relative to the position sensor; and
determining the gap width difference between the initial gap width and the test gap width in step (e) includes measuring a distance moved by the housing fixture in step (d) as measured from the initial position relative to the position sensor.

14. The method of claim 13, wherein:
the position sensor includes at least three sensor elements;
at least three linear actuators are coupled between the housing fixture and one of the member fixture or the test platform;
mounting the housing in the housing fixture in step (a) includes, for each of the at least three sensor elements, measuring a position of a corresponding measurement feature of the housing fixture relative to the sensor element, the initial position being an average of the at least three measured positions;
moving one of the housing fixture or the member fixture, such that the first capacitor plate and the second capacitor plate of the capacitive force sensor are substantially parallel in step (d) includes:
d1) actuating each of the at least three linear actuators to move the housing fixture relative to the member fixture;
d2) for each sensor element, measuring a distance, relative to the sensor element, moved by the corresponding measurement feature of the housing fixture as measured from the position measured by the sensor element in step (a); and
d3) if the at least three distances measured in step (d2) are not substantially equal, actuating one or more of the at least three linear actuators, and repeating steps (d2) and (d3); and
determining the gap width difference between the initial gap width and the test gap width in step (e) includes averaging the at least three distances measured in step (d).

15. The method of claim 9, wherein predetermined number of times to repeat steps (d), (e), and (f) is one.

16. A method of characterizing a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device, the method comprising:
a) mounting the housing of the personal electronic device in a housing fixture;
b) mounting the internal structural member in a member fixture such that the first capacitor plate and the second capacitor plate of the capacitive force sensor are substantially parallel and separated by an initial gap width;
c) measuring an initial capacitance value between the first capacitor plate and the second capacitor plate of the capacitive force sensor;
d) moving one of the housing fixture or the member fixture, such that the first capacitor plate and the second capacitor plate of the capacitive force sensor are substantially parallel and separated by a test gap width;
e) determining a gap width difference between the initial gap width and the test gap width;
f) measuring a test capacitance value between the first capacitor plate and the second capacitor plate of the capacitive force sensor;
g) repeating steps (d), (e), and (f) a predetermined number of times; and
h) calculating a capacitive sensor gain, a capacitive sensor offset and an initial effective separation between the first capacitor plate and the second capacitor plate based on the initial capacitance value, the test capacitance values, and the corresponding test gap width differences between the first capacitor plate and the second capacitor plate;
wherein calculating the capacitive sensor gain, the capacitive sensor offset, and the initial effective separation between the first capacitor plate and the second capacitor plate in step (h) includes:
h1) generating a system of at least three simultaneous equations using the equation, $$C_N = K_{off} + (K_{gain}/(z_{eff} + \Delta z_N)),$$

where N in an integer that runs from 0 to the predetermined number plus 1, $C_0$ is the initial capacitance value, $C_N$ is the Nth test capacitance value for N greater than 0, $K_{off}$ is the capacitive sensor offset, $K_{gain}$ is the capacitive sensor gain, $z_{eff}$ is the initial effective separation between the first capacitor plate and the second capacitor plate, $\Delta z_O$ is equal to 0, and $\Delta z_N$ is the Nth test gap width difference between the first capacitor plate and the second capacitor plate for N greater than 0; and
h2) solving the system of at least three simultaneous equations for the capacitive sensor gain, $K_{gain}$, the capacitive sensor offset, $K_{off}$, and the initial effective separation between the first capacitor plate and the second capacitor plate, $z_{eff}$.

17. The method of claim 9, wherein:
the first capacitor plate and the second capacitor plate of the capacitive force sensor are designed to form an array of capacitive sensing elements;
measuring the initial capacitance value between the first capacitor plate and the second capacitor plate of the capacitive force sensor in step (c) includes measuring an element initial capacitance value for each capacitive sensing element in the array of capacitive sensing elements;
measuring the test capacitance value between the first capacitor plate and the second capacitor plate of the capacitive force sensor in step (f) includes measuring an element test element capacitance value for each capacitive sensing element in the array of capacitive sensing elements; and
calculating the capacitive sensor gain, the capacitive sensor offset and the initial effective separation between the first capacitor plate and the second capacitor plate in step (h) includes, for each capacitive sensing element in the array of capacitive sensing elements, calculating an element capacitive sensor gain, an element capacitive sensor offset and an element initial effective separation based on the corresponding element initial capacitance value, the corresponding element test capacitance values, and the corresponding test gap width differences between the first capacitor plate and the second capacitor plate.

18. A method of characterizing a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device, the method comprising:
   a) mounting the housing of the personal electronic device in a housing fixture;
   b) mounting the internal structural member in a member fixture such that the first capacitor plate and the second capacitor plate of the capacitive force sensor are substantially parallel and separated by an initial gap width;
   c) measuring an initial capacitance value between the first capacitor plate and the second capacitor plate of the capacitive force sensor;
   d) moving one of the housing fixture or the member fixture, such that the first capacitor plate and the second capacitor plate of the capacitive force sensor are substantially parallel and separated by a test gap width;
   e) determining a gap width difference between the initial gap width and the test gap width;
   f) measuring a test capacitance value between the first capacitor plate and the second capacitor plate of the capacitive force sensor;
   g) repeating steps (d), (e), and (f) a predetermined number of times;
   h) calculating a capacitive sensor gain, a capacitive sensor offset and an initial effective separation between the first capacitor plate and the second capacitor plate based on the initial capacitance value, the test capacitance values, and the corresponding test gap width differences between the first capacitor plate and the second capacitor plate;
   i) moving one of the housing fixture or the member fixture, such that the first capacitor plate and the second capacitor plate of the capacitive force sensor are substantially parallel and separated by the initial gap width;
   j) fixedly coupling the internal structural member of the personal electronic device to the housing of the personal electronic device; and
   k) releasing the internal structural member from the member fixture.

19. The method of claim 18, further comprising:
   l) measuring a calibration capacitance value between the first capacitor plate and the second capacitor plate of the capacitive force sensor, the calibration capacitance value measured with zero applied force on the flexible element of the personal electronic device; and
   m) calculating a calibrated effective separation between the first capacitor plate and the second capacitor plate with zero applied force based on the capacitive sensor gain, the capacitive sensor offset, and the calibration capacitance value measured in step (l).

20. A method of recalibrating a capacitive force sensor that has previously been characterized to determine a capacitive sensor gain, a capacitive sensor offset, and a calibrated effective separation between a first capacitor plate and a second capacitor plate of the capacitive force sensor with zero applied force, the method comprising:
   a) measuring a recalibration capacitance value between the first capacitor plate and the second capacitor plate of the capacitive force sensor, the recalibration capacitance value measured with zero applied force on the capacitive force sensor; and
   b) calculating a recalibrated effective separation between the first capacitor plate and the second capacitor plate with zero applied force based on the capacitive sensor gain, the capacitive sensor offset, and the recalibration capacitance value between the first capacitor plate and the second capacitor plate of the capacitive force sensor; wherein
   calculating the recalibrated effective separation between the first capacitor plate and the second capacitor plate in step (b) includes solving the equation, $$z_{\it{eff\_Recal}} = K_{gain}/(C_{Recal} - K_{\it{off}}),$$

where $C_{Recal}$ is the recalibration capacitance value measured in step (a), $K_{\it{off}}$ is the capacitive sensor offset, $K_{gain}$ is the capacitive sensor gain, $z_{\it{eff\_Recal}}$ is the recalibrated effective separation between the first capacitor plate and the second capacitor plate, for the recalibrated effective separation between the first capacitor plate and the second capacitor plate, $z_{\it{eff\_Recal}}$.

21. The method of claim 20, wherein:
   the first capacitor plate and the second capacitor plate of the capacitive force sensor are designed to form an array of capacitive sensing elements;
   the capacitive sensor gain determined during characterization includes an element capacitive sensor gain corresponding to each capacitive sensing element in the array of capacitive sensing elements;
   the capacitive sensor offset determined during characterization includes an element capacitive sensor offset corresponding to each capacitive sensing element in the array of capacitive sensing elements;
   the calibrated effective separation between a first capacitor plate and a second capacitor plate of the capacitive force sensor determined during characterization includes an element calibrated effective separation corresponding to each capacitive sensing element in the array of capacitive sensing elements;
   measuring the recalibration capacitance value between the first capacitor plate and the second capacitor plate of the capacitive force sensor in step (a) includes measuring an element recalibration capacitance value for each capacitive sensing element in the array of capacitive sensing elements; and
   calculating the recalibrated effective separation between the first capacitor plate and the second capacitor plate in step (b) includes, for each capacitive sensing element in the array of capacitive sensing elements, calculating an recalibrated element effective separation based on the corresponding element capacitive sensor gain, the corresponding element capacitive sensor offset, and the corresponding recalibration capacitance value measured in step (a).

22. The method of claim 20, wherein calculating the recalibrated effective separation between the first capacitor plate and the second capacitor plate in step (b) includes solving the equation, $$z_{\it{eff\_Recal}} = K_{gain}/(C_{Recal} - K_{\it{off}}),$$

where $C_{Recal}$ is the recalibration capacitance value measured in step (a), $K_{\it{off}}$ is the capacitive sensor offset, $K_{gain}$ is the capacitive sensor gain, $z_{\it{eff\_Recal}}$ is the recalibrated effective separation between the first capacitor plate and the second capacitor plate, for the recalibrated effective separation between the first capacitor plate and the second capacitor plate, $z_{\it{eff\_Recal}}$.

23. A capacitive force sensor characterization system for calibrating a capacitive force sensor included in a personal electronic device, the capacitive force sensor including a first capacitor plate coupled to a flexible element of the personal electronic device and a second capacitor plate coupled to an internal structural member of the personal electronic device, the flexible element being coupled to a housing of the personal electronic device and the internal structural member not being coupled to the housing during characterization, the capacitive force sensor characterization system comprising:

a housing fixture adapted to hold the housing of the personal electronic device;

a member fixture adapted to hold the internal structural member of the personal electronic device;

a positioner coupled to at least one of the housing fixture or the member fixture, the positioner adapted to vary a gap width between the first capacitor plate and the second capacitor plate in response to a drive signal;

a position sensor adapted to measure differences in the gap width between the first capacitor plate and the second capacitor plate relative to an initial gap width;

control circuitry electrically coupled to the positioner to provide the drive signal to the positioner, the control circuitry adapted to generate the drive signal following a test procedure such that, in response to the drive signal, the positioner varies the gap width between the first capacitor plate and the second capacitor plate from the initial gap width to at least two test gap widths; and a processor electrically coupled to the first capacitor plate, the second capacitor plate, and the position sensor, the processor adapted to determine:

a capacitive sensor gain;

a capacitive sensor offset; and an initial effective separation between the first capacitor plate and the second capacitor plate;

wherein:

the position sensor is further coupled to the control circuitry and is further adapted to provide position information to the processor, the position information including a test difference in the gap width between the first capacitor plate and the second capacitor plate corresponding to each test gap width; and the processor is further adapted to:

measure an initial capacitance value between the first capacitor plate and the second capacitor plate at the initial gap width between the first capacitor plate and the second capacitor plate;

measure a test capacitance value between the first capacitor plate and the second capacitor plate corresponding to each test gap width between the first capacitor plate and the second capacitor plate; and determine the capacitive sensor gain, the capacitive sensor offset and the initial effective separation between the first capacitor plate and the second capacitor plate based on the initial capacitance value, the test capacitance values, and the corresponding test differences in the gap width between the first capacitor plate and the second capacitor plate; wherein:

the position sensor includes at least three sensor elements, arranged such that the at least three sensor elements may provide at least three local differences in the gap width between the first capacitor plate and the second capacitor plate;

the position sensor is further adapted to provide control information to the control circuitry, the control information includes the at least three local differences in the gap width;

the control circuitry is further adapted to generate the drive signal based on control information such that, following each variation of the gap width in the test procedure, the at least three local differences in the gap width are substantially equal, thereby substantially maintaining a relatively tilt angle between the first capacitor plate and the second capacitor plate;

the positioner includes at least three linear actuators; and the at least three linear actuators are coupled to the at least one of the housing fixture or the member fixture in a configuration such that the gap width between the first capacitor plate and the second capacitor plate is varied in response to the drive signal while substantially maintaining the relative tilt angle between the first capacitor plate and the second capacitor plate.

24. The capacitive force sensor characterization system of claim 23, wherein each of the at least three sensor elements of the position sensor includes at least one of:

a precision laser distance sensor; or a precision capacitive distance sensor coupled to one of the at least three linear actuators.

* * * * *